US012604578B2

(12) United States Patent
Ukawa et al.

(10) Patent No.: US 12,604,578 B2
(45) Date of Patent: Apr. 14, 2026

(54) LIGHT-EMITTING DEVICE AND METHOD OF MANUFACTURING THE LIGHT-EMITTING DEVICE

(71) Applicant: NICHIA CORPORATION, Anan (JP)

(72) Inventors: Hiroaki Ukawa, Itano-gun (JP); Noriaki Akita, Anan (JP)

(73) Assignee: NICHIA CORPORATION, Anan (JP)

( * ) Notice: Subject to any disclaimer, the term of this patent is extended or adjusted under 35 U.S.C. 154(b) by 921 days.

(21) Appl. No.: 17/673,572

(22) Filed: Feb. 16, 2022

(65) Prior Publication Data

US 2022/0262997 A1 Aug. 18, 2022

(30) Foreign Application Priority Data

Feb. 18, 2021 (JP) ................................. 2021-024427

(51) Int. Cl.
| | |
|---|---|
| *H10H 20/856* | (2025.01) |
| *H10H 20/01* | (2025.01) |
| *H10H 20/857* | (2025.01) |
| *H10W 90/00* | (2026.01) |

(52) U.S. Cl.
CPC ........ *H10H 20/856* (2025.01); *H10H 20/857* (2025.01); *H10W 90/00* (2026.01); *H10H 20/0363* (2025.01); *H10H 20/0364* (2025.01)

(58) Field of Classification Search
CPC ..... H01L 33/60; H01L 33/62; H01L 25/0753; H01L 25/167; H01L 2933/0058; H01L 2933/0066; H10H 20/857; H10H 20/0363; H10H 20/0364; H10H 29/8321;
(Continued)

(56) References Cited

U.S. PATENT DOCUMENTS

| | | | | |
|---|---|---|---|---|
| 2002/0008325 | A1* | 1/2002 | Tominaga | ............... H01L 23/13 |
| | | | | 257/E21.511 |
| 2005/0236639 | A1* | 10/2005 | Abe | .................... H10H 20/857 |
| | | | | 257/E33.059 |

(Continued)

FOREIGN PATENT DOCUMENTS

| | | | | |
|---|---|---|---|---|
| CN | 101740560 | * | 6/2010 | ......... H10H 20/8506 |
| JP | 109-069591 A | | 3/1997 | |

(Continued)

*Primary Examiner* — Mary A Wilczewski
(74) *Attorney, Agent, or Firm* — Spencer Fane LLP

(57) ABSTRACT

A method of manufacturing a light-emitting device, including: disposing a light-emitting part on a first electrically conductive wiring, and electrically connecting the light-emitting part with the first electrically conductive wiring and with a second electrically conductive wiring via wires; providing a mask member including a mask part including a first covering part to be located above the light-emitting part, and a second covering part connected to the first part and to be located around lateral sides of the light-emitting part, the second covering part defining grooves to allow the wires to pass through; disposing the mask member on the electrically conductive wiring; disposing a resin material to at least partially cover the mask member, the first electrically conductive wiring, and the second electrically conductive wiring; and removing the mask member to obtain a resin member having lateral walls surrounding the light-emitting part.

12 Claims, 21 Drawing Sheets

(58) Field of Classification Search
CPC ............. H10H 20/856; H10H 20/8506; H10H
20/036; H10W 90/00
See application file for complete search history.

(56) References Cited

U.S. PATENT DOCUMENTS

| | | | |
|---|---|---|---|
| 2007/0158669 A1* | 7/2007 | Lee ...................... H10H 20/857 | |
| | | | 438/27 |
| 2009/0053850 A1 | 2/2009 | Nishida et al. | |
| 2009/0166657 A1 | 7/2009 | Yamada et al. | |
| 2010/0140648 A1 | 6/2010 | Harada et al. | |
| 2012/0091489 A1 | 4/2012 | Aoki et al. | |
| 2012/0153327 A1* | 6/2012 | Kim ...................... H10H 20/856 | |
| | | | 438/27 |
| 2012/0286220 A1 | 11/2012 | Takasu et al. | |
| 2016/0284952 A1 | 9/2016 | Takeda | |
| 2018/0097164 A1* | 4/2018 | Katsumata ........... H10H 20/857 | |
| 2019/0305177 A1* | 10/2019 | Takamatsu ........... H10H 20/856 | |
| 2019/0371974 A1* | 12/2019 | Hussell ................ H10D 62/054 | |
| 2022/0262997 A1* | 8/2022 | Ukawa .................. H01L 25/167 | |
| 2024/0057451 A1* | 2/2024 | Yanagisawa ..... H10K 59/80521 | |

FOREIGN PATENT DOCUMENTS

| | | | | | |
|---|---|---|---|---|---|
| JP | 2001-009863 | A | | 1/2001 | |
| JP | 2006-303482 | A | | 11/2006 | |
| JP | 2007-311416 | A | | 11/2007 | |
| JP | 2008-047665 | A | | 2/2008 | |
| JP | 2009-182307 | A | | 8/2009 | |
| JP | 2010-140942 | A | | 6/2010 | |
| JP | 2012-089555 | A | | 5/2012 | |
| JP | 2016-103636 | | * | 6/2016 | .......... H10H 20/857 |
| JP | 2016-184714 | A | | 10/2016 | |
| JP | 2016-201545 | A | | 12/2016 | |
| JP | 2017-043780 | A | | 3/2017 | |
| JP | 2021-009898 | A | | 1/2021 | |

* cited by examiner

S1 — Providing electrically conductive wiring

S2 — Disposing light-emitting element and connecting wire

S3 — Providing mask member

S4 — Disposing mask member on electrically conductive wiring

S5 — Disposing resin material

S6 — Curing resin material

S7 — Removing mask member to obtain resin member

S8 — Cutting resin member

LIGHT-EMITTING DEVICE AND METHOD OF MANUFACTURING THE LIGHT-EMITTING DEVICE

CROSS-REFERENCE TO RELATED PATENT APPLICATION

The present application claims priority under 35 U. S. C. § 119 to Japanese Patent Application No. 2021-024427, filed on Feb. 18, 2021. The contents of this application are incorporated herein by reference in their entirety.

BACKGROUND

Technical Field

The present disclosure relates to a light-emitting device and a method of manufacturing the light-emitting device.

Description of Related Art

In recent years, light-emitting devices using light-emitting diodes (LEDs) have been employed for various applications and light-emitting devices with high light-emitting characteristics suitable for respective applications and methods of manufacturing those light-emitting devices have been proposed (for example, Japanese Unexamined Patent Application Publication No. 2009-182307).

SUMMARY OF THE INVENTION

However, there is a need for a method of manufacturing light-emitting devices with further improved production efficiency.

It is an object of the present disclosure to provide a method of manufacturing a light-emitting device with higher productivity, and to provide a light-emitting device manufactured by using such a method.

A first aspect of the invention provides a method of manufacturing a light-emitting device, including: providing an electrically conductive wiring including a first electrically conductive wiring and a second electrically conductive wiring; disposing a light emitting part including at least one light-emitting element on the first electrically conductive wiring, and electrically connecting the light-emitting part with the first electrically conductive wiring and with the second electrically conductive wiring via wires; providing a mask member, the mask member including a mask part including a first covering part to be located above the light-emitting part, and a second covering part connected to the first part and to be located around lateral sides of the light-emitting part, the second covering part defining grooves to allow the wires to pass through respectively, from the light-emitting part to an upper surface of the first electrically conductive wiring and from the light-emitting part to an upper surface of the second electrically conductive wiring; disposing the mask member on the electrically conductive wiring so that the mask member covers the light-emitting part; disposing a resin material to at least partially cover outer surfaces of the mask member, the first electrically conductive wiring, and the second electrically conductive wiring; and removing the mask member to obtain a resin member having lateral walls surrounding the light-emitting part.

According to a second aspect of the present disclosure, A light-emitting device includes a first electrically conductive wiring, a second electrically conductive wiring, a light-emitting part, wires and a resin member. The light-emitting part is disposed on the first electrically conductive wiring. The light-emitting part includes at least one light-emitting element. The wires electrically connect the light-emitting unit with the first electrically conductive wiring and with the second electrically conductive wiring respectively. The resin member supports the first electrically conductive wiring and the second electrically conductive wiring. The resin member includes lateral wall portions surrounding lateral sides of the light-emitting part, and protruding portions protruding from the lateral wall portions toward the light-emitting part. The protruding portions respectively enclose a connecting portion between the first electrically conductive wiring and a corresponding one of the wires and a connecting portion between the second electrically conductive wiring and a corresponding one of the wires.

According to one aspect of the present disclosure, it is possible to provide a method of manufacturing a light-emitting device with high manufacturing efficiency and to provide a light-emitting device manufactured by using the method.

DETAILED DESCRIPTION OF EMBODIMENTS

Figure 1A:
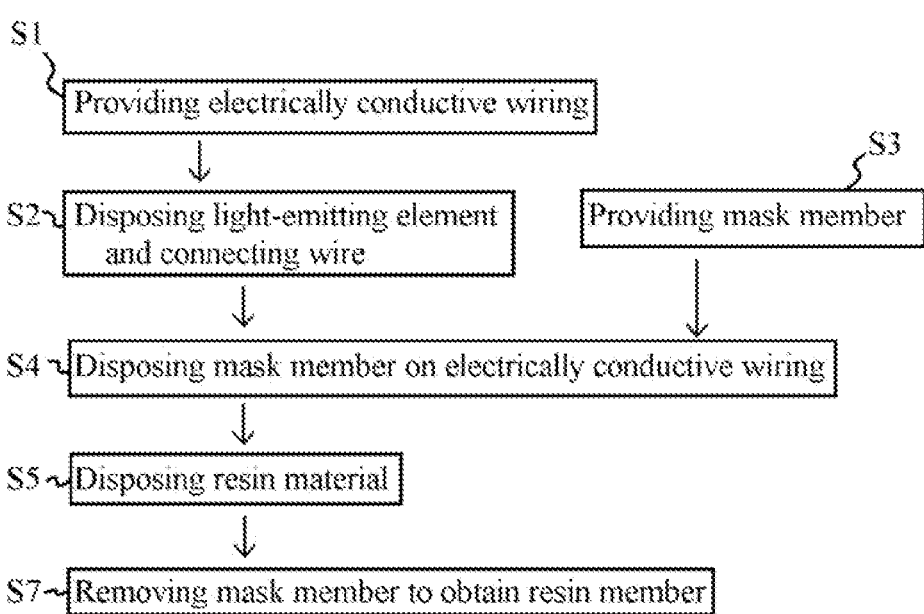
FIG. 1A is a flowchart illustrating a method of manufacturing a light-emitting device according to one embodiment of the present invention.

Certain embodiments of the present invention will be described below with reference to the accompanying drawings. The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. Further, in the description below, the same designations or the same reference numerals denote the same or like members and duplicative descriptions will be appropriately omitted. In addition, in the present specification, the term "flush with (in a same plane)", "same", or the like allows variations such as a variation in a range of several micron meters to several tens of micron meters.

Light-Emitting Device

A light-emitting device 10 according to the present embodiment will be described with reference to FIG. 1A to FIG. 7B.

Figure 7A:
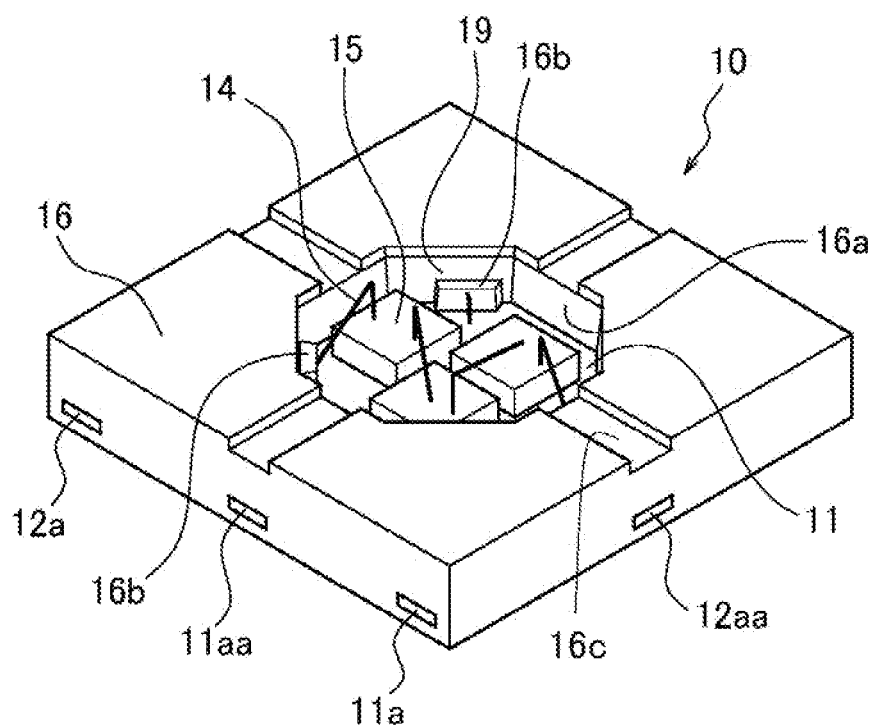
FIG. 7A is a schematic perspective view of a light-emitting device according to one embodiment of the present invention.

As shown in FIGS. 3A and 3B and FIGS. 7A and 7B, the light-emitting device 10 according to the present embodiment includes, an electrically conductive wiring 13 that includes a first electrically conductive wiring 11 and a second electrically conductive wiring 12, light-emitting elements 15 (collectively constituting a light-emitting part) disposed on the first electrically conductive wiring 11, wires 14 respectively electrically connecting the light-emitting elements 15 and the first electrically conductive wiring 11, and electrically connecting the light-emitting elements 15 and the second electrically conductive wiring 12, and a resin member 16 supporting the first electrically conductive wiring 11 and the second electrically conductive wiring 12. The resin member 16 includes lateral walls 16a surrounding lateral sides of the light-emitting element 15, and protrusions 16b each protruding a corresponding one of the lateral walls 16a toward the light-emitting elements 15. As shown in FIG. 7A, the protrusions 16b respectively enclose connecting portions between the first electrically conductive wiring 11 and a corresponding one of the wires 14 and between the second electrically conductive wiring 11 and a corresponding one of the wires 14.

Thus, providing the lateral walls 16a surrounding lateral sides of the light-emitting elements 15 allows efficient reflection of light from the light-emitting elements 15, which allows for an improvement in the light extraction efficiency of the light-emitting device 10. Further, providing the lateral walls 16a close to the area around the light-emitting elements 15 allows for a reduction in the size of the resin member 16, which allows for a reduction in size of the light-emitting device 10. The protrusions 16b protruding from the lateral walls 16a respectively enclose portions of the first electrically conductive wiring 11, the second electrically conductive wiring 12, and wires 14. Accordingly, exposure of the electrically conductive wiring 13 can be reduced, and when silver or a silver alloy is applied on surfaces of the electrically conductive wiring 13, the effect of the external environment on the surfaces of the electrically conductive wiring 13 can be reduced or prevented, and thus sulfurization of metal on the surfaces of the electrically conductive wiring 13 that is attributed to water ingress from the external environment can be efficiently reduced or prevented. Also, minimizing the exposure of the wires 14 as much as possible allows to reduce the absorption of light by the wires, which can further improve the light extraction efficiency. Further, the connecting portions of the wires 14 are covered by the resin member 16, which reduces the load applied from the external forces, thereby improving the reliability of the light-emitting device 10.

In light-emitting device 10, the resin member 16 is preferably formed of a resin material that contains a light-reflecting material, as described below. Accordingly, the lateral walls 16a surrounding the lateral sides of the light-emitting elements are formed of a resin material that contains a light-reflecting material such that light emitted from the light-emitting elements 15 can be reflected upward at the lateral walls 16a and extracted efficiently. Inner surfaces of the lateral walls 16a may be positioned perpendicular to the surface on which the light-emitting elements is disposed or to an upper surface of the resin member 16, but the inner wall surfaces are preferably inclined to increase respective widths upward from the mounting surface of the at least one light-emitting element 15. In a plan view, the shape of the lateral wall 16a may be a triangle, square, or other polygon with rounded corners, but the positioning surface of light-emitting element 15 is larger. It is desirable that the higher-order polygon or its corners have rounded shapes, such as hexagons and octagons, in order to facilitate the placement of light-emitting devices. Circular or elliptical, etc. are more desirable.

Figure 7B:
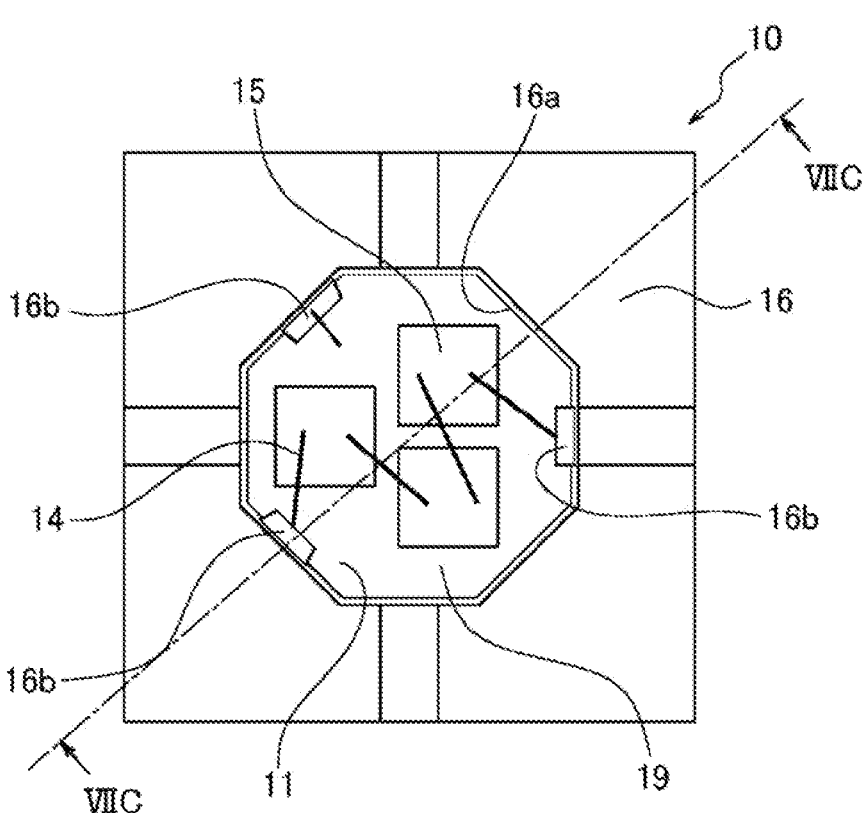
FIG. 7B This a schematic plan view of a light-emitting device according to one embodiment of the present invention.
Figure 7C:
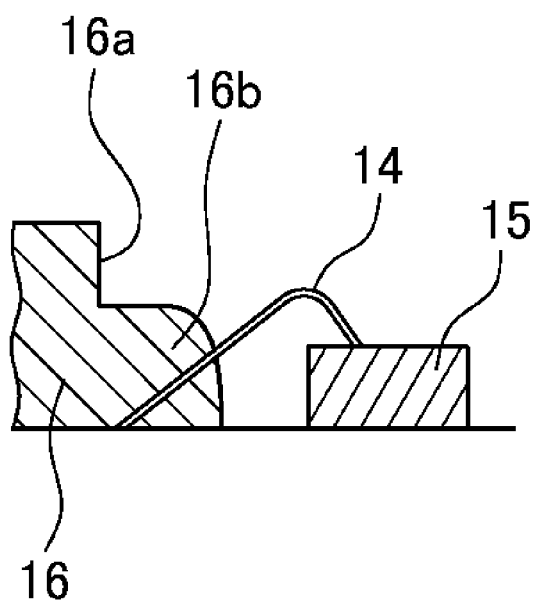
FIG. 7C is a schematic cross-sectional view taken along line VIIC-VIIC of FIG. 7B, illustrating a main portion.
Figure 7D:
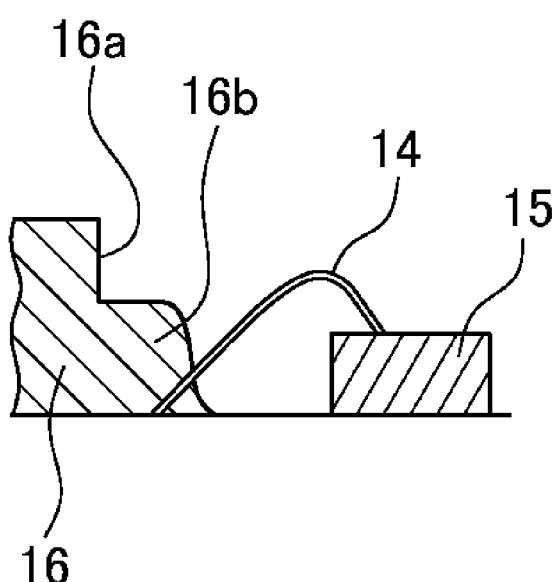
FIG. 7D is a schematic cross-sectional view taken along line VIIC-VIIC of FIG. 7B, illustrating another example of main portion.

Either a single or a plurality of the protrusions 16*b* may be disposed on the resin member 16. The protruding portions 16*b* are located from the first electrically conductive wiring 11 side or the second electrically conductive wiring 12 side of the lateral walls 16*a* and are partially extended along the height of the lateral walls 16*a*. The shape and size of the protruding portions 16*b* can be adjusted by the position and shape of the groove 22*a* in the second covering part 22 of the mask member 20 to be described below, and also by the viscosity and a method of applying the resin material also to be described below. For example, the height of the protruding portions 16*b* can be set in a range of 10 to 50%, preferably in a range of 30 to 60% of the height of the lateral walls 16*a*. The degree of protrusion toward the light-emitting elements 15 is, for example, in a range of 100 to 400 μm. In particular, the protruding portions 16*b* are not formed by using a mold, but are formed by a resin material entering along a groove of the mask member described below, so that the protruding portions 16*b* have smooth lateral surfaces. In other words, when the resulting resin member is used in a light-emitting device, the protruding portions have lateral surfaces with inclinations that widen the opening of the recess upward. Further, the protruding portions 16*b* which are respectively continuous from the lateral walls 16*a* of the recess of the resin member, have for example, the width and height matching the depth and width of the grooves of the mask member. The protruding portions 16*b* have, for example as shown in FIG. 7A, a convex surface curved from each upper surface outward toward the light-emitting elements disposed within the recess of the resin member as shown in FIG. 7C, or as shown in FIG. 7D, a recessed surface curved from each upper surface inward with respect to the light-emitting elements disposed within the recess of the resin member. In particular, it is preferable that the protruding portions 16*b* are spaced apart from the light-emitting elements 15 in a plan view at a distance smaller than or equal to the shortest distance between the lateral walls 16*a* free of the protruding portions 16*b* and the light-emitting elements 15. With the arrangement of the protruding portions 16*b* as described above, the exposed area of the surfaces of the electrically conductive wiring 13 can be reduced. Accordingly, when a metal containing silver is disposed on the surfaces of the electrically conductive wiring 13, the external environment will have less effect on the metal containing silver on the surfaces of the electrically conductive wiring 13, and it will reduce sulfurization of silver attributed mainly to a reaction with moisture can be reduced. Thus, a reduction in the optical reflectance at the surfaces of the electrically conductive wiring 13 can be reduced or prevented and the light extraction efficiency can be improved. Also, exposure of the wires can also be reduced, such that absorption of light by the wires is reduced, which can contribute to further improvement in the light extraction efficiency.

In the light-emitting device 10, the resin member 16 can have an outer shape of a polygonal shape such as a quadrangular shape, a circular shape or an elliptic shape in a plan view. The outer lateral surfaces of the resin member 16 may have a curved portion but preferably have flat surfaces. The outer lateral surfaces of the resin member 16 may be tilted upward from the mounting surface of the light-emitting elements, but it is preferable that the outer lateral surfaces of the resin member 16 are perpendicular or approximately perpendicular to the mounting surface of the light-emitting elements. On the outer lateral surfaces of the resin member 16, end surfaces of portions of the electrically conductive wiring 13 extending from the first electrically conductive wiring 11 and the second electrically conductive wiring 12 may be exposed. The end surfaces of the electrically conductive wiring 13 can be flush with the outer lateral surfaces of the resin member 16 to reduce the size of the light-emitting device.

Moreover, on the lower surface of the resin member 16, which serves as the lower surface of the light-emitting device 10, the lower surface of the first electrically conductive wiring 11 and the second electrically conductive wiring 12 are exposed from the resin member 16, thereby improving the heat dissipation from the lower surfaces of the first electrically conductive wiring 11 and the second electrically conductive wiring 12. Further, the lower surface of the resin member 16 is flush with the lower surfaces of the first electrically conductive wiring 11 and the second electrically conductive wiring 12, thus improving the stability of the light-emitting device on the external wiring board.

It is preferable that the light-emitting device 10 further includes a light-transmissive member 19 that covers the light-emitting elements 15, as described below. With this arrangement, the light-emitting elements 15 and the wires 14 can be protected from the external environment.

Variational Examples of Light-Emitting Device

Figure 8A:
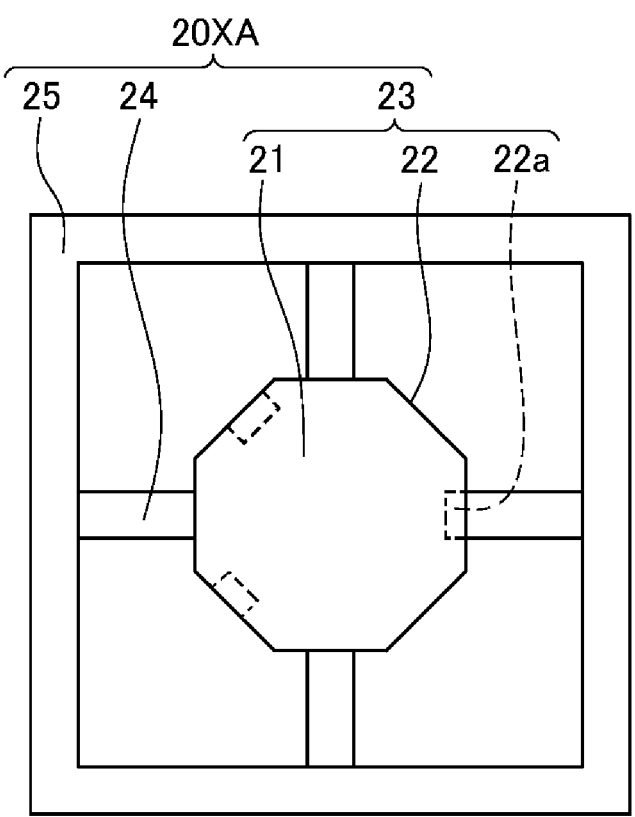
FIG. 8A is a schematic plan view of a mask member employed in manufacturing a light-emitting device according to another embodiment of the present invention.
Figure 8B:
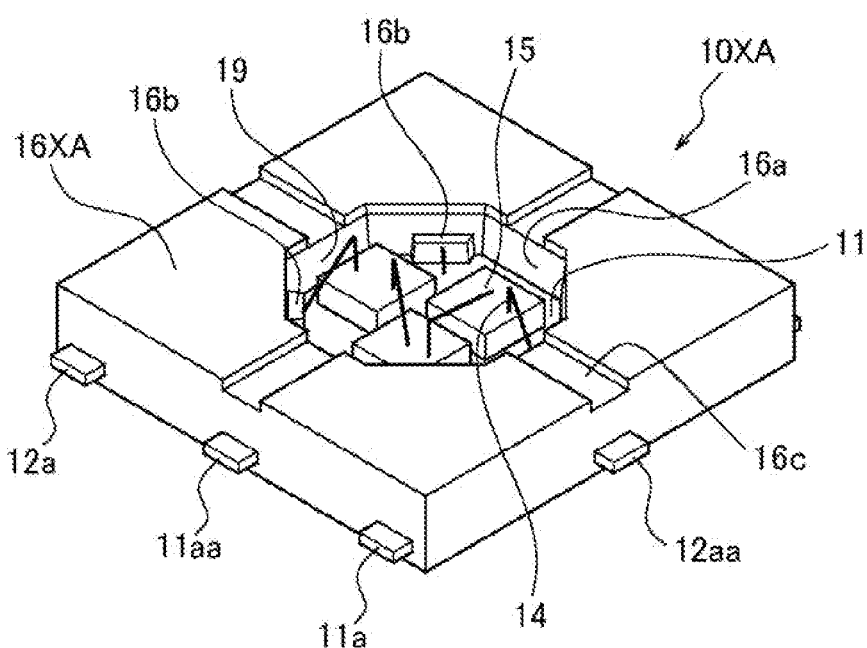
FIG. 8B is a schematic perspective view of a light-emitting device according to another embodiment of the present invention.
Figure 8C:
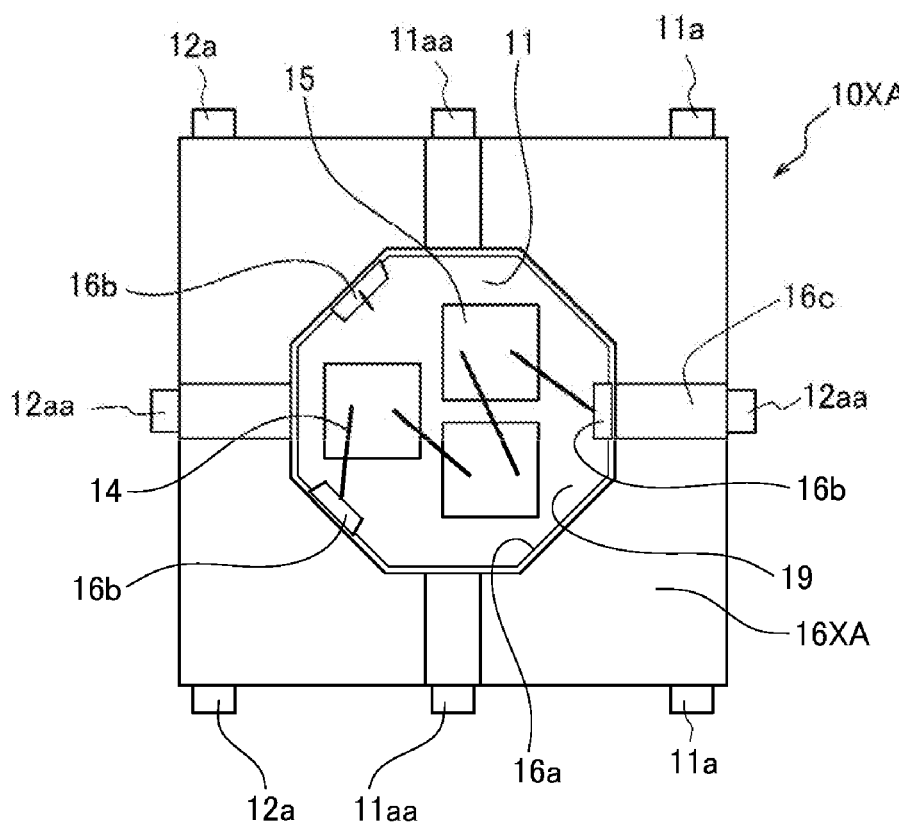
FIG. 8C is a schematic plan view of a light-emitting device according to another embodiment of the present invention.

Next, variational examples of the light-emitting device will be described with reference to FIG. 8A to FIG. 8C. FIG 8A shows a schematic plan view of a mask material used to manufacture the light-emitting device 10XA, which is a variational example of the light-emitting device. FIG. 8B is a schematic perspective view of a light-emitting device 10XA, which is a variational example of the light-emitting device. FIG. 8C is a schematic plan view of the light-emitting device 10XA, which is a variational example of the light-emitting device.

In the light-emitting device 10XA, portions of the electrically conductive wiring 13 extending from the first electrically conductive wiring 11 and the second electrically conductive wiring 12, for example, a first support portion 11*a*, a second support portion 12*a*, a first connection portion 11*aa*, and a second connection portion 12*aa* may present on the outer lateral surfaces of the resin member 16XA. Those portions may be protruded from the outer lateral surfaces 16XA. As described below, those portions can be formed in various shapes by adjusting the shape of the frame part 25 of the mask member 20XA as shown in FIG. 8A, or the viscosity of the resin material of the resin member 16XA. For example, forming the mask member with portions of the frame part 25 defining grooves along the shape of the electrically conductive wiring such that the grooves are located at both the sides of corresponding portions of the electrically conductive wiring, or by setting the viscosity of the resin material at a relatively high value, all the surfaces of the first support parts 11*a* that are protruded from the resin member 16XA can be exposed from the resin member 16XA, as shown in FIG. 8B.

Thus, the first support portions 11*a*, the second support portions 12*a*, the first connection portion 11*aa*, the second connection portion 12*aa*, etc., are ejected from the outer side of the resin member 16XA. If the light-emitting device 10XA is placed on an external wiring board, it is possible to connect the external wiring board and wiring board to the wiring by placing the splicing material so that it covers the protruding area above.

Method of Manufacturing Light-Emitting Device

Next, a method of manufacturing the light-emitting device 10 according to the present embodiment will be described with reference to FIG. 1A through FIG. 7B.

Figure 1B:
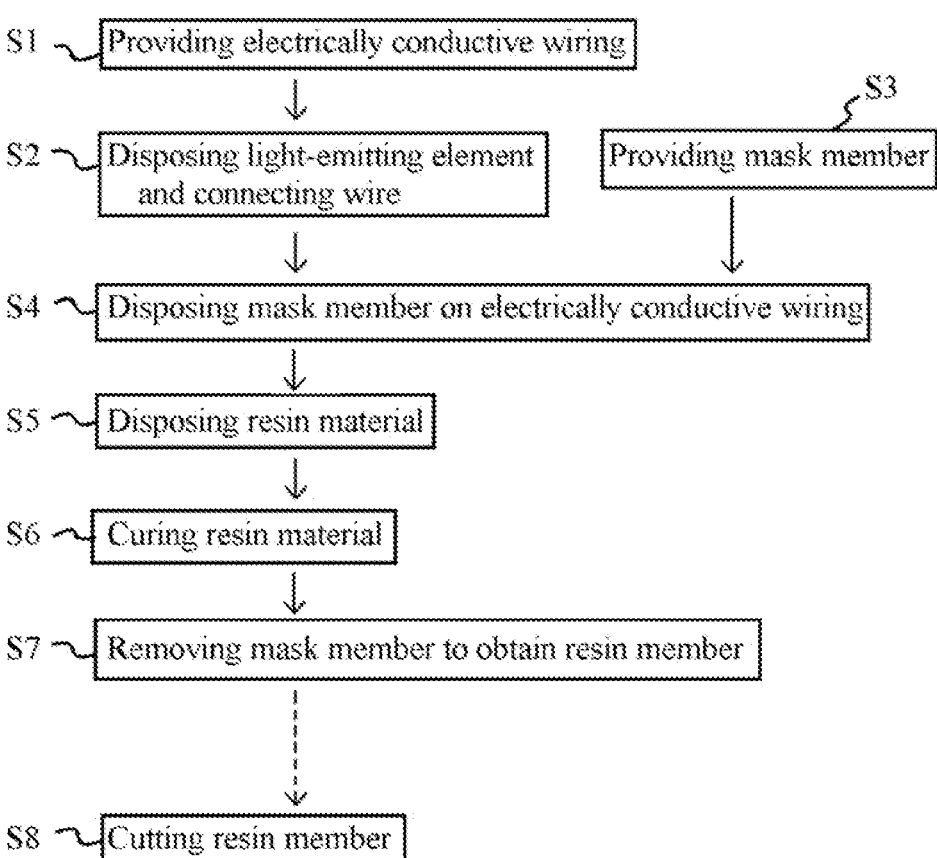
FIG. 1B is a flowchart illustrating a method of manufacturing a light-emitting device according to another embodiment of the present invention.

As shown in FIG. 1A and FIG. 1B, a method of manufacturing the light-emitting device 10 according to the present embodiment include steps of at least (S1) to (S5) and (S7) described below, may also include (S6) and/or (S8) as needed.

(S1) providing an electrically conductive wiring 13 including a first electrically conductive wiring 11 and a second electrically conductive wiring 12;

(S2) disposing light-emitting elements 15 on the first electrically conductive wiring 11 and electrically connecting the light-emitting elements 15 and the first electrically conductive wiring 11 and the light-emitting elements 15 and the second electrically conductive wiring 12 through wires respectively;

(S3) providing a mask member 20 including a mask part 23 that includes a first covering part 21 to cover above the light-emitting elements 15 and a second covering part 22 to surround lateral sides of the light-emitting elements 15 and be connected to the first covering part 21, the second covering part 22 defines grooves 22a to allow wires 14 to pass therethrough from the light-emitting elements 15 to an upper surface of the first electrically conductive wiring 11 or from the light-emitting elements 15 to an upper surface of the second electrically conductive wiring 15, respectively;

(S4) providing the mask member 20 on the electrically conductive wiring 13 such that the mask part 23 covers the light-emitting elements 15;

(S5) providing a resin material 17 on outer lateral surfaces of the mask member 20 and the second electrically conductive wiring 12;

(S6) curing the resin material 17 disposed in the step of (S5);

(S7) removing the mask member 20 to obtain a resin member 16 including lateral walls 16a surrounding the light-emitting elements 15; and (S8) as needed, dividing the resin member 16 such that a resulting light-emitting device includes predetermined components and has a predetermined size.

Thus, with the use of the mask member, the resin member is disposed close to the light-emitting elements while covering portions of the electrically conductive wiring and portions of the wires to minimize the exposure of the electrically conductive wiring and the wires. This reduces or prevents degradation of the electrically conductive wiring, reduces the load on the wires and secures the connection of the wires to the electrically conductive wiring, and facilitates manufacturing of high-quality, high-precision light-emitting devices.

The curing of the resin material may be performed after removing the mask member, but in the present method of manufacturing, resin may be hardened before the removal of the mask material. It is preferable to remove the mask material after the plastic is cured (S6) to prevent mold collapse. Further, after forming the resin member 16, a light-transmissive member 19 may be disposed to cover the at least one light-emitting element 15.

In the present manufacturing method, a single unit of electrically conductive wiring (FIGS. 2A and 2B) corresponding to a single light-emitting device may be used, but it is preferable to use a multi-unit electrically conductive wiring (FIG. 9), which corresponds to a plurality of light-emitting devices. When a multi-unit electrically conductive wiring, which corresponds to a plurality of light-emitting devices is used, dividing can be preferably performed later in the manufacturing to obtain individual light-emitting devices or predetermined groups of light-emitting devices. This allows obtaining of larger numbers of light-emitting devices in fewer steps, which can further improve the manufacturing efficiency.

Providing Electrically Conductive Wiring: S1

Figure 2A:
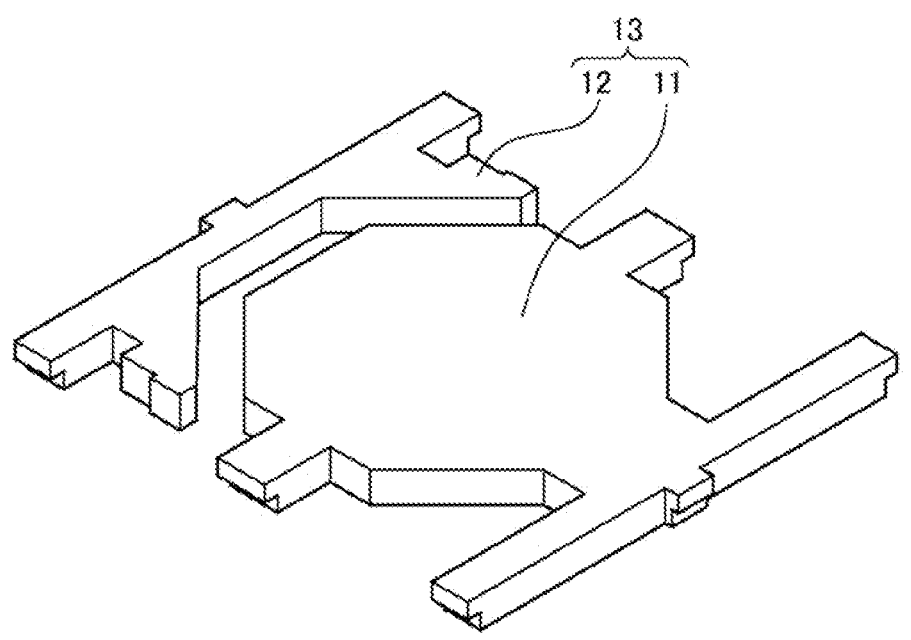
FIG. 2A is a schematic perspective view of an electrically conductive wiring for illustrating a method of manufacturing a light-emitting device according to one embodiment of the present invention.
Figure 2B:
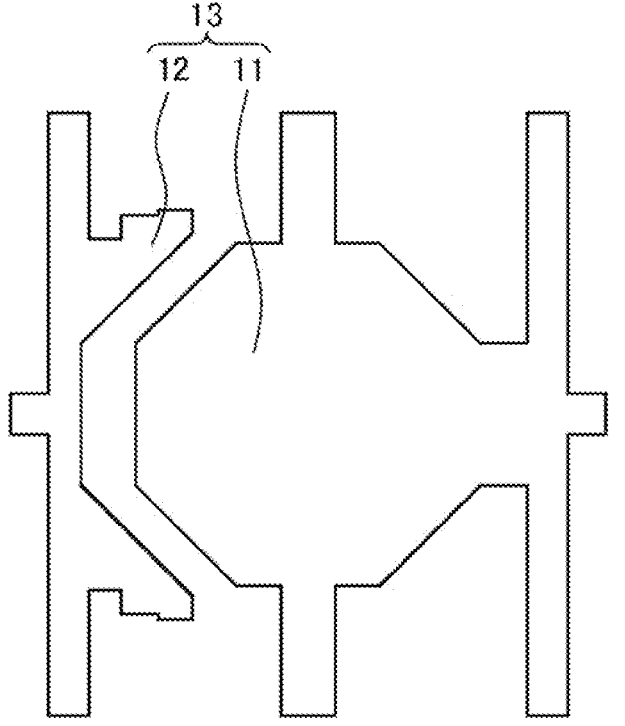
FIG. 2B is a schematic plan view of an electrically conductive wiring for illustrating a method of manufacturing a light-emitting device according to one embodiment of the present invention.
Figure 9:
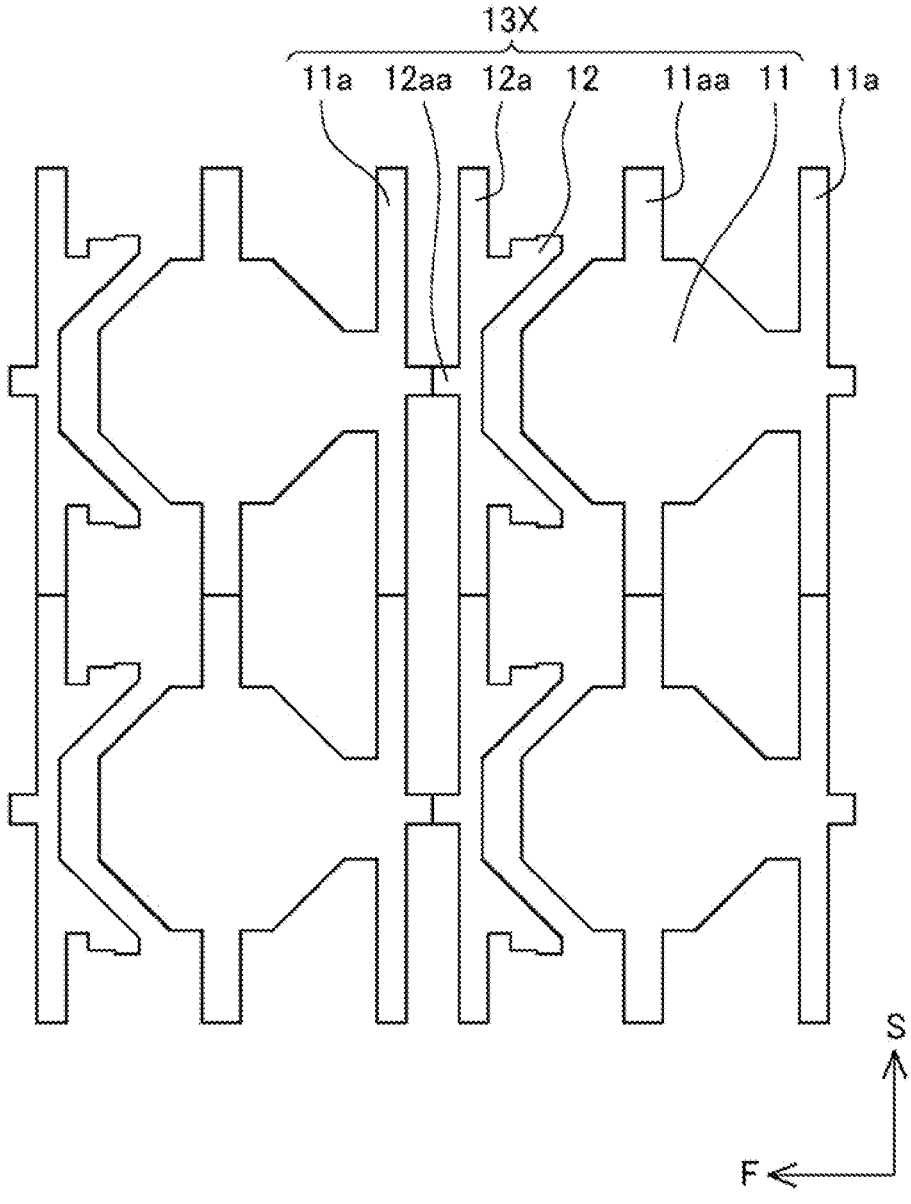
FIG. 9 is a schematic plan view of an electrically conductive wiring for illustrating a method of manufacturing a light-emitting device according to another embodiment of the present invention.

Electrically conductive wiring 13 is provided. As shown in FIGS. 2A and 2B, the electrically conductive wiring 13 includes at least the first electrically conductive wiring 11 and the second electrically conductive wiring 12. The electrically conductive wiring 13 may be provided as a single unit containing a single first electrically conductive wiring 11 and a single electrically conductive wiring 12 correspond to a single light-emitting device, or may be provided as a lead frame in which, as shown in FIG. 9 and described later below, a plurality of single units are aligned and connected in a first direction F and a second direction S orthogonal to the first direction F.

When the light-emitting device is in operation, the first electrically conductive wiring 11 and the second electrically conductive wiring 12 serve as positive and negative electrodes to supply electricity to the light-emitting elements 15.

The electrically conductive wiring 13 is configured to such that the light-emitting elements are disposed on the first electrically conductive wiring 11 and the light-emitting elements are electrically connected to the first electrically conductive wiring 11 and to the second electrically conductive wiring 12. Accordingly, for example, the first electrically conductive wiring 11 preferably has planar dimensions greater than that of the second electrically conductive wiring 12. The first conductive wiring 11 may have planar dimensions sufficient for disposing a single light-emitting element, but preferably have planar dimensions that allows disposing of a plurality of light-emitting elements, for example, more preferably have planar dimensions sufficient for disposing three light-emitting elements. The second electrically conductive wiring 12 does not necessarily have dimensions for disposing the at least one light-emitting element but preferably has dimensions that allow greater than one wire bonding to the at least one light-emitting element. For example, the second conductive wiring 12 preferably has planar dimensions sufficient for one or more wire bonding and for disposing one or more protective elements. The first electrically conductive wiring 11 and the second electrically conductive wiring 12 are disposed facing each other. For example, it is preferable that the second electrically conductive wiring 12 is disposed facing the first electrically conductive wiring 11 so that the second electrically conductive wiring 12 surrounds a portion of the first electrically conductive wiring 11. More specifically, one or more sides of the outer periphery of the first electrically conductive wiring 11 are facing the second electrically conductive wiring 12, or $\frac{1}{5}$ or more or $\frac{1}{4}$ or more of the outer periphery of the first electrically conductive wiring 11 is facing the second electrically conductive wiring 12, and $\frac{1}{2}$ or less is facing the second electrically conductive wiring 12. Such portions of the first electrically conductive wiring 11 and the second electrically conductive wiring 12 may face each other at either a substantially uniform distance or different distances. By adjusting such a distance, occurrence of short circuit between the first electrically conductive wiring 11 and the second electrically conductive wiring 12, disconnection of wire bonding, or the like, can be efficiently prevented or reduced.

In the step of providing the electrically conductive wiring 13, a removable support or a removable tape is preferably attached on a surface (back surface) of the electrically conductive wiring 13 located opposite side of the surface where the light-emitting element is to be disposed. With this arrangement, when disposing a resin material as to be described later below, unnecessary attachment of the resin material on the back surface of the electrically conductive wiring 13 can be avoided, which can improve the workability. Also, lower surfaces of the first electrically conductive wiring 11 and the second electrically conductive wiring 12 can be exposed from the lower surface of the resin member 16, such that the lower surface of the resin member 16 and the lower surfaces of the first electrically conductive wiring 11 and the second electrically conductive wiring 12 can be made flush with each other.

It is preferable that the electrically conductive wiring 13 has a base part and a metal layer covering the base part. The base part may be formed with a single layer structure or a multilayer structure (for example, a cladding metal) of metal(s) such as copper, aluminum, gold, silver, iron, nickel, or alloy thereof, phosphor bronze, iron copper, etc. The metal layer may be formed with a single layer structure or a multilayer structure of metal(s) such as silver, aluminum, nickel, palladium, rhodium, chromium, gold, copper, or alloy thereof. The electrically conductive wiring 13 may have different materials placed on its front and back surfaces or on portions of the front and back surfaces. The electrically conductive wiring 13 may have a substantially uniform thickness or may have an uneven thickness. For example, a thin film area may be provided at the outer periphery of the first electrically conductive wiring 11 or/and the second electrically conductive wiring 12 and the side opposite from of the side for disposing the light-emitting elements, or a protruding portion may be provided at the first electrically conductive wiring 11 or/and the second electrically conductive wiring 12 and at the side for disposing the light-emitting elements and at its opposite side. Having such a thin film portion or protruding portion can increase a contact area with the resin material to be described below, which improves the adhesion between the electrically conductive wiring 13 and the resin member.

The electrically conductive wiring 13 can be formed with any appropriate shape by applying a technique or a combination of techniques such as pressing, etching, electrolytic plating, electroless plating, vapor deposition, or sputtering, on the base part described above. Etching may be performed, for example, partially from the upper surface side or the lower surface side of the base part. For example, the electrically conductive wiring 13 may have an outermost surface covered with a material having high reflectivity, such as a plating layer of silver or silver alloy, or may be applied with hard chrome-plating or the like. When Au bumps are used for the placement of the light-emitting element, the bonding between light-emitting elements and the substrate can be improved if Au is used on the top surface of the electrically conductive wiring 13.

Disposing Light-Emitting Element and Connecting Wires: S2

Figure 3A:
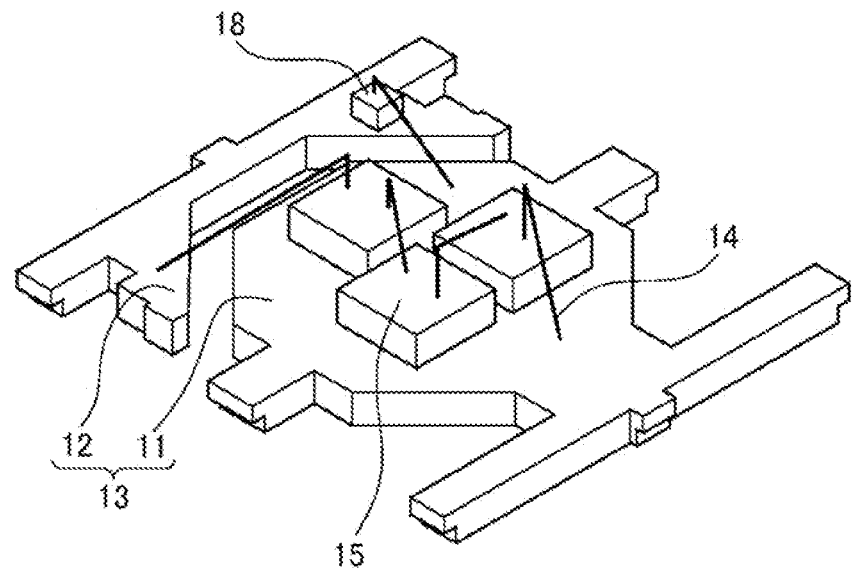
FIG. 3A is a schematic perspective view of an electrically conductive wiring for illustrating a method of manufacturing a light-emitting device according to one embodiment of the present invention.
Figure 3B:
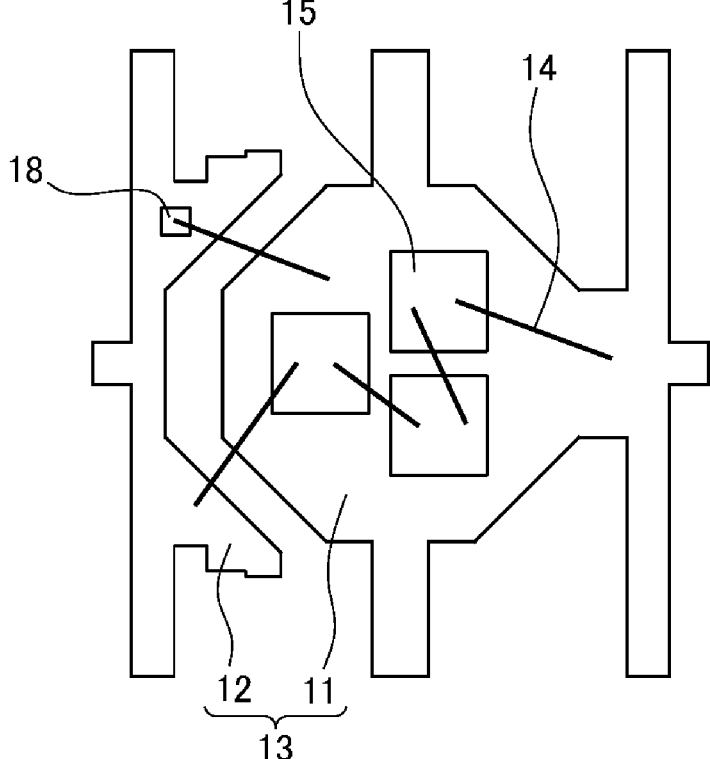
FIG. 3B is a schematic plan view of an electrically conductive wiring for illustrating a method of manufacturing a light-emitting device according to one embodiment of the present invention.

As shown in FIGS. 3A and 3B, light-emitting elements 15 to be disposed on the electrically conductive wiring 13 are provided.

For the light-emitting elements 15, semiconductor light-emitting elements such as light-emitting diode elements can be used. In particular, nitride-based semiconductors that can emit light in a range of ultraviolet to visible light are employed for the light-emitting elements 15. The light-emitting elements 15 may have positive and negative electrodes disposed on a same surface side, or on different surface sides. It is preferable, for example, the light-emitting elements 15 have positive and negative electrodes on a same surface side. With this arrangement, the light-emitting elements 15 can be disposed with its surface having the electrodes facing upward and its surface opposite to the surface having the electrodes facing the electrically conductive wiring 13.

Either a single light-emitting element 15 or a plurality of light-emitting elements 15 can be disposed on the electrically conductive wiring 13, for example, on the first electrically conductive wiring 11. When two light-emitting elements are employed, for example, light-emitting elements to emit light of different wavelengths can be employed.

The light-emitting elements 15 may be disposed, for example, on the first electrically conductive wiring 11 via a bonding member. In this case, depending on the configuration of the electrodes of the light-emitting elements, the light-emitting elements may be disposed in a face-up manner and in a flip-chip manner in a single light-emitting device. Examples of the bonding member include an electrically conductive resin, a solder such as tin-bismuth-based solder, tin-copper-based solder, tin-silver-based solder, gold-tin-based solder, an electrically conductive paste or bump of silver, gold, palladium, or the like, an anisotropic conductive material, and a brazing material such as a low-melting-point metal.

When a plurality of light-emitting elements 15 are employed, the light-emitting elements 15 can be electrically connected by wires in series, in parallel or in a combination thereof, and then appropriately electrically connected to the first electrically conductive wiring 11 and to the second electrically conductive wiring 12. In this case, the wires are electrically connected to at least one region on the first electrically conductive wiring 11 and at least one region on the second electrically conductive wiring 12.

For example, when the light-emitting device includes a protective element 18, for example, a protective element 18 may be disposed on the second electrically conductive wiring 12. The protective element is configured to protect light-emitting element(s) from static electricity or high-voltage surges, and examples of the protective element include a Zener diode. The protective element 18 may be electrically connected, for example, in parallel to the light-emitting element(s) 15.

Providing Mask Member: S3

Figure 4A:
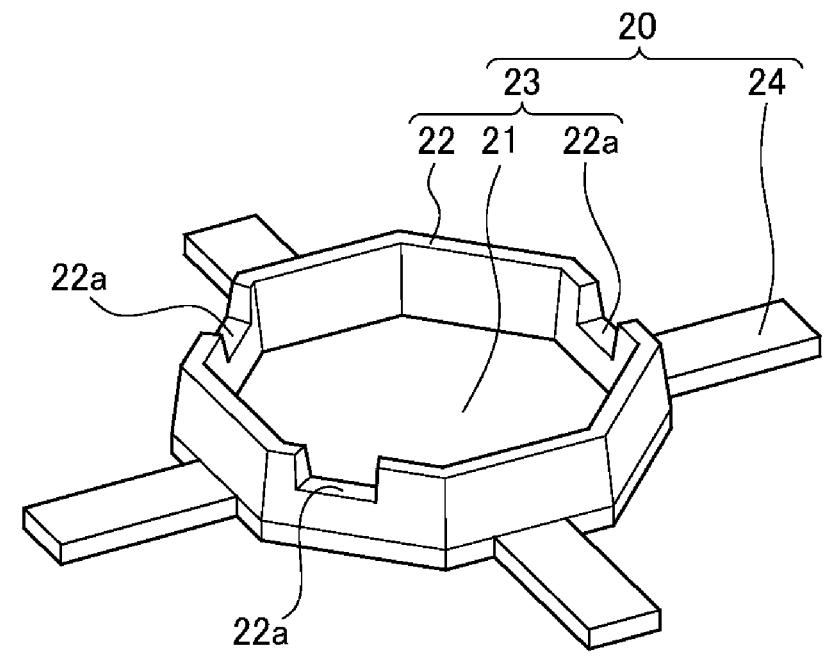
FIG. 4A is a schematic perspective view of a mask member for illustrating a method of manufacturing a light-emitting device according to one embodiment of the present invention.
Figure 4B:
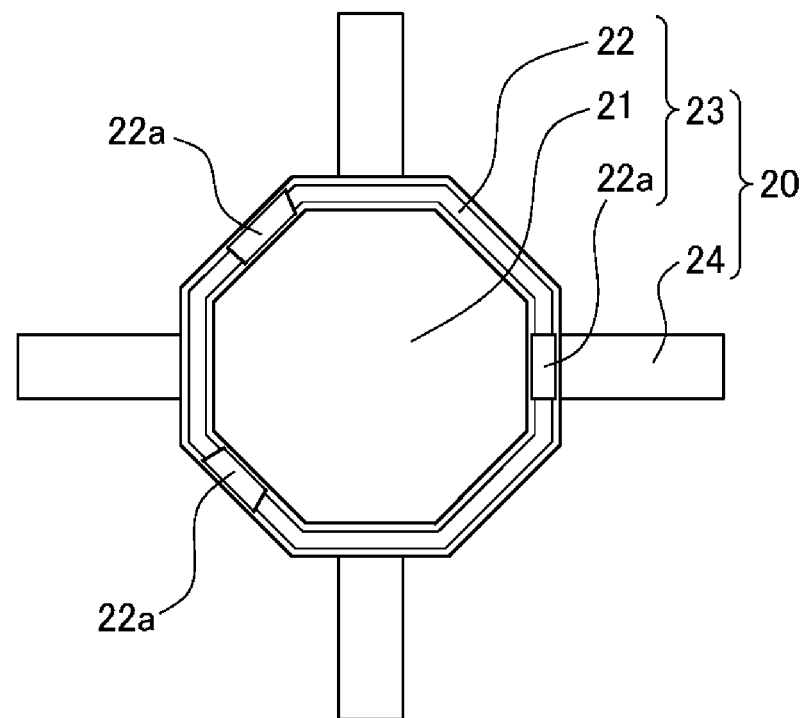
FIG. 4B is a schematic plan view of a mask member for illustrating a method of manufacturing a light-emitting device according to one embodiment of the present invention.

As shown in FIGS. 4A and 4B, a mask member 20 is provided. The mask member 20 has a mask part 23 including a first covering part 21 configured to cover above the light-emitting elements 15, and a second covering part 22 configured to surround lateral sides of the light-emitting elements 15 and is connected to the first covering part 21. The mask member 20 may have connection parts 24 as described below.

The shape and size of the first covering part 21 can be appropriately set according to the number and size of the light-emitting elements 15 to be disposed on the first electrically conductive wiring 11. For example, in a plan view, the first covering part 21 can have a shape greater than an area on the first electrically conductive wiring 11 for mounting the light-emitting elements 15. When a plurality of light-emitting elements 15 are designed to be disposed on the first electrically conductive wiring 11, the first covering part 21 can have a shape greater than the area of the first electrically conductive wiring 11 corresponding to disposing the light-emitting elements 15. The first covering part 21 can be formed with for example, a circular shape or an elliptic shape, a polygonal shape such as a triangular shape, a quadrangular shape, a hexagonal shape, an octagonal shape, or a shape to those, in a plan view.

When silver, silver alloy, or the like is applied on the outermost surface of the electrically conductive wiring 13 as described above, the silver may convert to silver sulfide over time, resulting in black discoloration, and reducing the light reflectance. Meanwhile, as described above, in a plan view, the inner wall surfaces of the first covering part 21 are designed in conformity to, similar to, or slightly greater than the shape of the region for disposing the light-emitting elements 15. With this arrangement, the inner wall surfaces defining the recess of the resin member can be located as close as possible to the light-emitting elements, thus reducing the exposed area of the electrically conductive wiring 13. Accordingly, the electrically conductive wiring 13 can be protected from the external environment, which can efficiently reduce or prevent degradation such as discoloration of the exposed electrically conductive wiring 13 over time. This allows ensuring the long-term quality of light-emitting devices with high light extraction efficiency.

The first covering part 21 may have an irregular structure or/and curved portion(s) on its surface(s), or may have an uneven thickness or a uniform thickness. Among those, the first covering part 21 preferably has a flat shape with a constant thickness. The configuration described above can facilitate the manufacturing of the mask member.

The inner wall surfaces of the second covering part 22 surround the light-emitting elements 15, while the outer wall surfaces of the second covering part 22 define the inner wall surfaces of the resin member that define the recess to be formed in the resin member. The inner wall surfaces defining the recess of the resin member surround lateral sides of the light-emitting elements 15. Therefore, it is preferable that the second covering part 22 is substantially orthogonally connected to the first covering part 21, or connected with inclination to the first covering part 21 such that each wall surface narrows toward the first covering part 21. The inclination can be, for example in a range of 1 to 10°, preferably in a range of 2 to 7°, with respect to a direction perpendicular to a plane of the first covering part 21. Such inclination facilitates removing of the mask member to be described later below. The first coating part 21 may have a curved portion but preferably have a flat surface. The first coating part 21 may have uneven thickness but preferably has a uniform thickness. It is preferable that the second covering part 22 is set to a height such that the first covering part 21 is not in contact with the wire(s) provided to the light-emitting elements 15 that are disposed on the electrically conductive wiring 13 via a bonding member. For example, the height of the second covering part 22 is preferably set to be approximately three to five times the height of the light-emitting elements disposed on the electrically conductive wiring 13, more specifically, the height can be in a range of 50 to 800 μm, preferably in a range of 80 to 400 μm.

From another perspective, when the thickness of the light-emitting elements is in a range of 200 to 280 μm, it is preferable to set a distance from the upper surface of the light-emitting element to the highest point of the wires to be in a range of 100 to 120 μm.

The second covering part 22 is formed with one or more grooves 22a to accommodate the wires such that when the mask member 20 is disposed on the electrically conductive wiring 13, contact between mask member 20 and the wirings can be avoided. Each of the grooves 22a is formed in a U shape, recessed from the end surface of the second covering part 22 toward the connection portion to the first covering part 21, in an end surface of the second covering part 22 opposite from the connection to the first covering part 21. The position of each of the grooves 22a is set to correspond to the location of the connection between corresponding wire 14 and the electrically conductive wiring 13 when the mask member 20 is disposed on the electrically conductive wiring 13. Therefore, the number of the grooves 22a can be the same as the number of the connection points between the wires 14 and the electrically conductive wiring 13. The width of each of the grooves 22a is preferably greater than a width corresponding to a length of a wire that is connected to the electrically conductive wiring 13 and passing across the second covering part 22 of the mask member 20, more specifically a width in a range of 300 to 500 μm. The depth of the grooves 22a can be set to smaller than the height of the second covering part 22, and in view of the mechanical strength of the mask member 20, the depth of the grooves 22a can be set to 70% or less, 60% or less, or 50% or less of the height of the second covering part 22, which is more specifically, in a range of 200 to 300 μm.

Regardless of the shape of the first covering part 21, the second covering part 22 can be formed with, for example, a circular or elliptical shape, a polygonal shape such as a triangular shape, a quadrangular shape, a hexagonal shape, an octagonal shape, or a shape similar to those, in a plan view. Though it is preferable that the second covering mart 22 has the same shape in a plan view as that of the first covering part 21, and is connected to the outer periphery of the first covering part 21.

The mask member 20 can be formed of any appropriate material, but to ensure its mechanical strength, for example, a metal such as copper, iron, aluminum, etc. can be employed. To facilitate removing the mask member 20 it is preferable to apply a release agent in advance on portions of the surfaces of the mast member 20 to be in contact with the resin material, or to dispose a releasing sheet between the mask member 20 and the resin material. The first covering part 21 and the second covering part 22 may be formed integrally, or the first covering part 21 and the second covering part 22 that are separately formed may be assembled to the mask member 20. In the latter case, either the same or different materials can be employed for the first covering part 21 and the second covering part 22.

Disposing Mask Member to Electrically Conductive
Wiring: S4

Figure 5A:
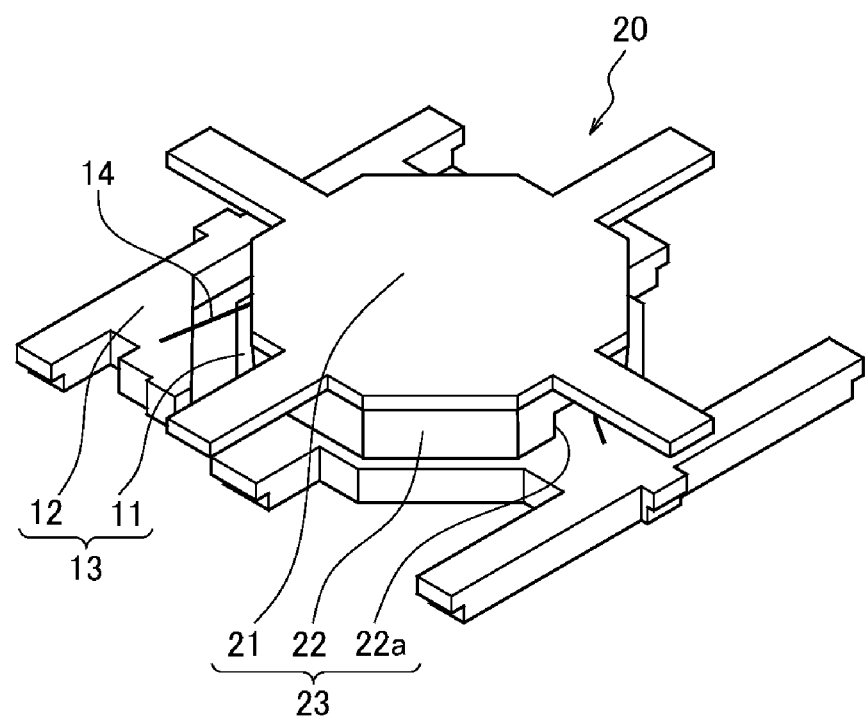
FIG. 5A is a schematic perspective view of an electrically conductive wiring and a mask member for illustrating a method of manufacturing a light-emitting device according to one embodiment of the present invention.
Figure 5B:
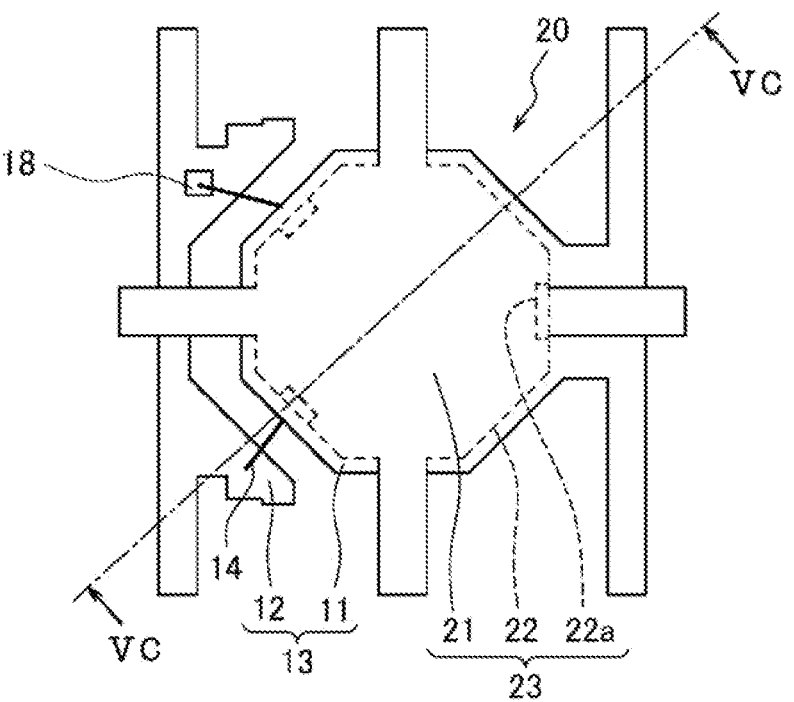
FIG. 5B is a schematic back view of a mask member for illustrating a method of manufacturing a light-emitting device according to one embodiment of the present invention.

As shown in FIGS. 5A and 5B, the mask member 20 is disposed on the electrically conductive wiring 13, for example, on the first electrically conductive wiring 11. In other words, the mask member 20 is disposed on the first electrically conductive wiring 11 so that the mask part 23 covers the at least one light-emitting element 15 disposed on the first electrically conductive wiring 11. In this case, the mask member 20 is disposed such that the second covering part 22 would not cause disconnection of the wires) 14 that connect the at least one light-emitting element 15 and the first electrically conductive wiring 11 and that connect the at least one light-emitting element 15 and the second electrically conductive wiring 12, preferably, the mask member 20 is disposed to accommodate the wire(s) 14 in the groove(s) 22*a* while avoiding contact between the wire(s) 14 and the mask member 20, Also, as described above, when a protective element 18 is disposed on the second electrically conductive wiring 12, the mask member 20 is disposed so as not to cause disconnection of the wire(s) 14 that connect the protective element 18 and the first electrically conductive wiring 11, preferably, the mask member 20 is disposed to accommodate the wire(s) 14 in the groove(s) 22*a* while avoiding contact between the wire(s) 14 and the mask member 20. With this arrangement, deformation or disconnection of the wire(s) 14 due to contact between the mask member and the wire(s) 14, the electrically Mask members 20 can be prevented from contacting the wire 14 can be reduced or prevented.

For this, as shown in FIG. 5B, in a plan view, the mask member 20 can be disposed on the electrically conductive wiring 13 such that at least one groove 22*a* formed in the second covering part 22 faces the second electrically conductive wiring 12.

Figure 5C:
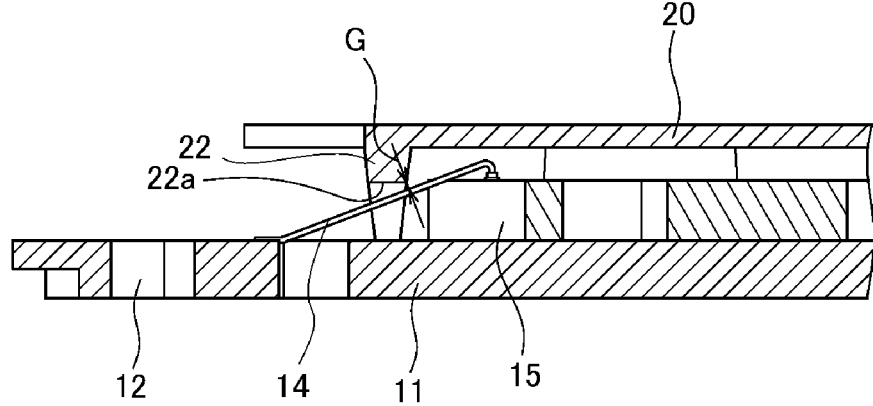
FIG. 5C is a schematic cross-sectional view taken along line VC-VC of FIG. 5B, illustrating a main portion.

Also, as shown in FIG. 5C, the mask member is disposed such that when the mask member 20 is placed on the electrically conductive wiring 13, the shortest gap G between the wire(s) 14 and the second covering part 22 at each groove 22*a* in the second electrically conductive wiring 22 is 100 μm or less. In order to obtain this configuration, in addition to adjusting the position of the mask member 20, adjusting the shape, size, and location of each groove 22*a*, as well as adjusting the shape of the wires 14 between the at least one light-emitting element 15, the first electrically conductive wiring 11 and the second electrically conductive wiring 12 may be conducted. Note that when a load to the wire(s) is of a degree that does not lead disconnection of the wire(s) as described above, contacting of the second covering part 22 and the wire(s) 14 can be tolerated, but the gap G of 50 μm is preferable.

As described above, the mask member 20 is disposed only on the first electrically conductive wiring 11, such that at the time of disposing the resin material to be described later below, entering of the resin material close to the light-emitting elements can be reduced as much as possible.

Disposing Resin Material: S5

Figure 6:
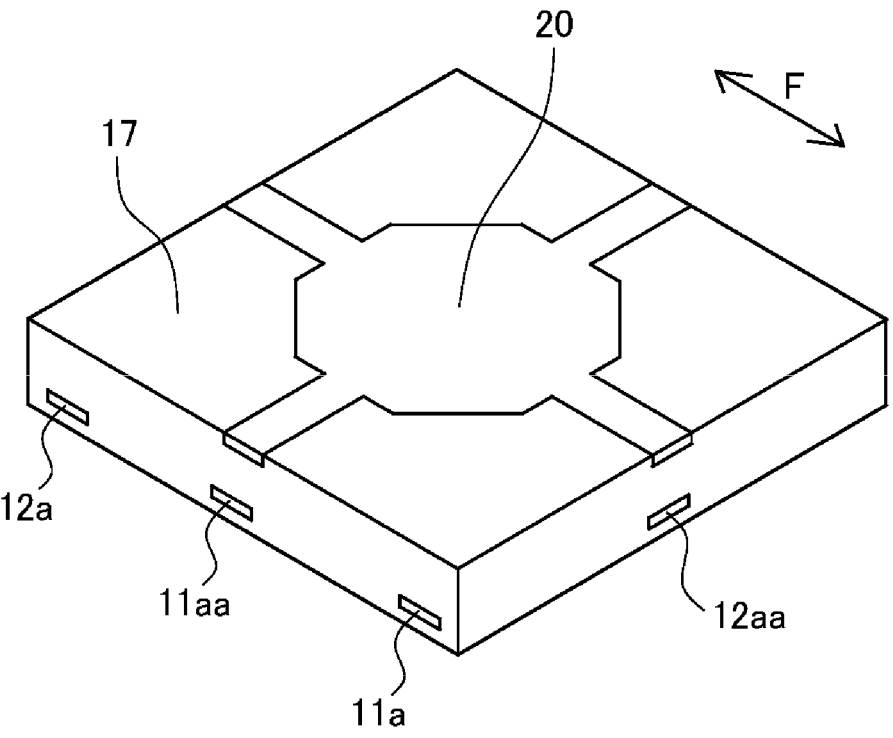
FIG. 6 is a schematic perspective view for illustrating a method of manufacturing a light-emitting device according to one embodiment of the present invention.

Subsequently, as shown in FIG. 6, the resin material 17 is disposed on the electrically conductive wiring 13 covered by the mask member 20, in other words, on the portions of the first electrically conductive wiring 11 and the second electrically conductive wiring 12 exposed from the mask member 20. This enables simultaneous manufacturing of the casing for the light-emitting device and the recess for disposing the light-emitting elements 15 to be described below, by a single process of disposing the resin material, and further, the electrically conductive wiring 13 can be secured by the resin member 16. Accordingly, workability and production efficiency can also be improved.

The resin material 17 can be applied by using a known technique in the field of molding resin, such as potting and printing. Among those, the disposing the resin material can be performed with good working efficiency by using a printing technique, applying the resin material on the electrically conductive wiring 13 covered by the mask member 20. Furthermore, the resin material can be applied with a small thickness through a printing technique, which allows a further reduction in the height of resulting light-emitting devices, and thus preferable.

It is preferable to apply the resin material 17 such that the outer principal surface of the first covering part 21 of the mask member 20 and the upper surface of the resin material 17 are flush with each other, providing a thinner light-emitting device, which allows a further reduction in the height of resulting light-emitting devices.

It is preferable to apply the resin material 17 to fill at least a portion of each of the grooves 22*a* of the second covering part 22 of the mask member 20. Accordingly, protruding portions lob corresponding to the shapes of the grooves 22*a* are formed as to be described below, in shapes respectively protruding from the lateral walls 16*a* toward the light-emitting elements 15. As a result, entering of the resin close to the light-emitting elements can be reduced as much as possible.

The degree of the resin material 17 entering the second covering part 22 can be controlled by adjusting the viscosity of the resin material, direction of applying the resin material 17, or the like. For example, a portion of the resin material 17 disposed outside of the mask member 20 may enter inward of the mask member 20 where the light-emitting elements 15 are disposed, through the groove(s) 22*a*. But applying the resin material appropriately adjusted as described above, can reduce or prevent such advance of the resin material 17.

For example, as described above, when the mask member 20 is disposed such that the second covering part 22 defining at least one groove 22 faces the second electrically conductive wiring 12 in a plan view, the resin member 17 is preferably applied using a printing technique, in which, for example, a squeegee pressingly in contact with the resin material is moved in a first direction (arrow F in FIG. 6) from the first electrically conductive wiring 11 toward the second electrically conductive wiring 12 or in the first direction F from the second electrically conductive wiring toward the first electrically conductive wiring. In this case, it is preferable that the outer wall surfaces of the second covering part 22 defining the at least one groove 22*a* is inclined relative to the first direction F. The inclination angle can be, for example, in a range of 10 to 80°, preferably in a range of 30 to 50°, more preferably 45° relative to the first direction F. Thus, with the outer wall surfaces of the second covering part 22 defining the at least one groove 22*a* is inclined relative to the first direction F, the amount of the resin material entering the inward area can be controlled. This arrangement allows for controlling the ingress of the resin material 17 into the interior of the second covering part 22, which allows for preventing lateral walls 16*a* or protruding portions 16*b* of the resulting resin member from contacting the light-emitting elements, while appropriately covering the connection part(s) between at least one of the first and second electrically conducting wirings 11, 12 and the wire(s). By covering the connection part(s), the degree of external load applied to the light-emitting device and exposure of the first electrically conductive wiring can be reduced.

Specific examples of the resin material 17 include an epoxy resin composition, a silicone resin composition, a modified epoxy resin composition such as a silicone-modified epoxy resin composition, a modified silicone resin composition such as an epoxy modified silicone resin composition, an unsaturated polyester resin, a saturated polyester resin, a polyimide resin composition, a modified polyimide resin composition, a polyphthalamide (PPA), a polycarbonate resin, polyphenylenesulfide (PPS), a liquid crystal polymer (LCT), an ABS resin, a phenol resin, an acrylic resin, and a PBT resin.

The resin material 17 is preferably a light-reflective resin containing a light-reflecting material. Examples of the light-reflecting material include titanium oxide, silicon oxide, zirconium oxide, potassium titanate, aluminum oxide, zinc oxide, aluminum nitride, boron nitride, and mullite. With the resin material 17 containing the light-reflecting material, light emitted from the light-emitting elements 15 can be reflected and efficiently extracted from the light-emitting device. For example, when titanium oxide is employed, titanium oxide can be contained in a range of 20 to 60 weight % with respect to the total weight of the resin material 17, The resin material 17 has a reflectance of preferably 60% or greater, more preferably 75% or greater, to the light from the light-emitting elements 15. The light-reflecting material in particle shape is preferably employed. The viscosity of the resin material can be adjusted by adjusting the content of the light-reflecting material in particle shape. Inclusion of a large amount of the light-reflecting material in particle shape can increase the viscosity of the resin material, while it also reduces the fluidity of the resin material, which may prevent the resin material from entering the at least one groove. Therefore, it is preferable to adjust the content of the light-reflecting material in particle shape with consideration of the viscosity of the resin material as well as an addition of a viscosity modifier to be described below.

In order to adjust the shape or/and the size, etc., of the protruding portions 16b as described above, for example, an additive such as a viscosity modifier or the like may be added in the resin material 17, Specific examples of such an additive include fumed silica and colloid silica. With the use of such an additive, the resin material of relatively high viscosity can be provided. Such an additive can be included at a ratio of 5 to 30 weight % relative to the total weight of the resin material 17. In other words, for example, the resin material 17 has a viscosity before curing in a range of 10 to 40 Pa·s, preferably in a range of 15 to 25 Pa·s. This arrangement can effectively prevent the resin material 17 from passing through the groove 22a and entering the interior of the second covering part 22 where the light-emitting elements 15 are located, as described above.

Curing Resin Material: S6

The resin material 17 may be cured before removing the mask member 20, With this, deformation etc. of the resin member can be reduced or prevented, which facilitates controlling of the direction of light. It also facilitates removing of the mask member 20. Curing resin can be appropriately set according to the resin material used, for example, for epoxy resin material and silicone resin material, the temperature can be in a range of 80 to 200° C. for a duration in a range of 1 to 20 minutes, preferably the temperature in a range of 80 to 150° C. for a duration of 1 to 10 minutes.

Removing Mask Member: S7

Subsequently, the mask member 20 is removed. Thus, the resin member 16 as shown in FIGS. 7A and 7B can be obtained (Obtaining Resin Member: S8). In other words, by applying the resin material at a single time, the casing of the light-emitting device and a recess for disposing the light-emitting elements can be simultaneously manufactured, thereby improving the workability and production efficiency in manufacturing the light-emitting device.

The resin member 16 serves as a casing to accommodate the light-emitting elements and the wires, with a recess of the casing formed in its upper surface side. Such a resin member 16 can have a circular or elliptic shape, a polygonal shape such as a triangular shape, a quadrangular shape, or a hexagonal shape, or a shape similar to those, in a plan view, and a column shape of those. The shape of the recess can be a polygon such as a triangular shape, a quadrangular shape, a hexagonal shape, or a shape similar to those, in a plan view. More specifically, an outer shape can be, for example, a rectangular parallelepiped shape or a shape similar to a rectangular parallelepiped shape, and the opening of the recess can be defined in an octagonal shape or a shape similar to an octagonal shape in a plan view.

Accordingly, the light-emitting device 10 shown in FIGS. 7A and 7B can be manufactured.

In place of the mask member 20 shown in FIGS. 4A and 4B, a mask member 20XA shown in FIG. 8A can be employed. The mask member 20XA includes connection parts 24 extending from the mask part 23 in opposite directions or two sets of opposite directions, and a frame part 25 corresponding to the outer periphery of the light-emitting device, and connected to the connection parts 24. With the use of the mask member 20XA, the light-emitting device 10XA shown in FIGS. 8B and 8C can be manufactured.

In other words, a light-emitting device 10X having portions of the first electrically conductive wiring 11 and the second electrically conductive wiring 12, which constitute the electrically conductive wiring 13, exposed from the resin member 16XA on the outer periphery of the light-emitting device can be manufactured. The degree of exposure of the electrically conductive wiring 13 can be appropriately set according to the width and shape of the frame part 25 of the mask member 20XA. For example, the length of the exposed portions of the electrically conductive wiring 13 with respect to corresponding outer lateral surfaces of the resin member 16XA can be in a range of 100 to 200 μm. The exposed portions of the electrically conductive wiring 13 allow for an increase in the contact area between the electrically conductive wiring 13 and the bonding member etc., when mounting the light-emitting device, which allows the light-emitting device firmly bonding to the mounting substrate etc.

The width, shape in a plan view, etc., of the connection parts 24 and the frame part 25 of the mask member 20XA can be set appropriately. For example, the connection parts 24 have a constant width, and as described above, located at four sides of the mask part 23 in a plan view. The connectors parts 24 preferably have a thickness and a width the same as that of the first covering part 21. In this case, it is preferable that the outer wall surfaces of the connecting parts 24 are flush with the outer wall surfaces of the first covering part 21, at a side opposite from the surface where the second covering part 22 is located. It is also preferable that one surface of the frame part 25 is flush with the surface of the first covering part 21 located opposite side of the surface where the second covering part 22 is located, and with the outer wall surface of the connection part 24. The frame part 25 defines the lateral surfaces of the light-emitting device 10XA shown in FIGS. 8B and 8C, such that the frame part 25 preferably has wall portions having a height same as that of the second covering part 22 of the light-emitting device 10XA shown in FIGS. 8B and 8C. With this configuration, the amount of the resin member used to form the resin member can be reduced and also a thickness of the light-emitting device can be further reduced.

As described above, when the mask member 20XA includes the connection parts 24, recesses (16c in FIG. 7A and FIG. 8B) corresponding to the connection parts 24 are formed in the upper surface of the resin member 16XA. Such recesses 16c can be used, for example, as recognition marks when mounting a light-emitting device on a mounting substrate, etc. The size, depth and shape of the recesses 16c can be set according to the size, thickness and shape of the connection parts 24 of the mask member 20XA.

Disposing Light-Transmissive Member 19

At any appropriate step after removing the mask member 20, a light-transmissive member 19 may be disposed in the recess defined by the lateral surfaces 16a of the resin member, to cover the light-emitting elements 15 disposed on the bottom surface of the recess. The light-transmissive member 19 preferably covers a portion or entire surfaces of the lateral walls 16a and the light-emitting elements 15, more preferably covers entire surfaces of the lateral walls 16a and the light-emitting elements 15. The light-transmissive member 19 may be disposed with any appropriate thickness as long as it covers the entire thickness direction and the upper surface of the light-emitting elements 15. For example, the light-transmissive member 19 is preferably disposed such that an upper surface of the light-transmissive member 19 is located at a similar height as or lower than the height of the lateral wall 16a.

For example, the light-transmissive member 19 is preferably formed of a material containing a resin. Examples of the resin include similar material as those illustrated above. Among those, a light-transmissive resin that allows transmission of 60% or greater, 70% or greater, 75% or greater, or 80% or greater of light emitted from the light-emitting elements 15 is preferable. Further, a fluorescent material that can convert the wavelength of a portion of light that enter the fluorescent material or/and a light-diffusing material may be contained in the material containing a resin.

The light-transmissive member 19 may contain a fluorescent material. Such a fluorescent material is configured to be excited by the light emitted from the light-emitting elements. Specific examples of the fluorescent material that can be excited by a blue light-emitting element or an ultraviolet light-emitting element include: yttrium aluminum garnet-based fluorescent materials activated with cerium (YAG: Ce), lutetium aluminum garnet-based fluorescent materials activated with cerium (LAG:Ce), silicate-based fluorescent materials activated with europium ($(Sr,Ba)_2SiO_2$:Eu), β-sialon-based fluorescent materials, nitride-based fluorescent materials such as $CaAlSiN_3$:Eu and $(Sr,Ca)AlSiN_3$:Eu, fluoride fluorescent materials activated with Mn, sulfide-based fluorescent materials, and quantum dot fluorescent materials. With a combination of one or more of the fluorescent materials described above and a blue light-emitting element or an ultraviolet light-emitting element, light-emitting devices to generate desired emission colors (for example, a light-emitting device to emit a mixed color light of white light) can be manufactured.

Examples of the light-diffusing material include titanium oxide, barium titanate, aluminum oxide, silicon oxide, zirconium oxide, fumed silica such as AEROSIL®, glass, glass fiber, and filler such as wollastonite.

The light-transmissive member 19 is preferably formed of a material having high fluidity and containing a thermosetting or photosetting resin in view of ease of reducing or preventing generation of voids, Such a material may exhibit fluidity with a viscosity in a range of 0.5 to 30 Pa·s, for example.

The light-transmissive member 19 can be applied for example by potting to cover the light-emitting elements 15. The light-transmissive member 19 thus applied may have a flat upper surface, or a lens-shaped upper surface such as a concave lens shape or a convex lens shape.

Variational Examples 1 of Method of Manufacturing Light-Emitting Device

In the method of manufacturing the light-emitting device 10 described above and illustrated in FIG. 1A or FIG. 1B, an electrically conductive wiring 13X as shown in FIG. 9 that has a collective structure (a collective electrically conductive wiring 13X) to form a plurality of light-emitting devices may be employed. Manufacturing the light-emitting device using the collective electrically conductive wiring 13X can improve the workability of the production of the light-emitting devices and also can increase the production efficiency.

Providing Electrically Conductive Wiring: S1

As shown in FIG. 9, the collective electrically conductive wiring may include a plurality of units of electrically conductive wiring 13 each corresponding to a single light-emitting device that are aligned and connected to one other in the first direction F and in the second direction S orthogonal to the first direction D. In FIG. 9, four units are shown, but an electrically conductive wiring including a larger number of units connected in the first direction F or the second direction S may also be employed. In the electrically conductive wiring 13X, the first electrically conductive wirings 11 aligned in a single column in the second direction S and the second electrically conductive wirings 12 aligned in a single column in the second direction S are alternately aligned in the first direction.

The electrically conductive wiring 13X also includes first support portions 11a each extending and aligned in the second direction S at a side opposite from the second electrically conductive wiring 12. The electrically conductive wiring 13X also includes second support portions 12a each extending and aligned in the second direction S at a side opposite from the first electrically conductive wiring 11. In other words, the first support portion 11a and the second support portion 12a are located between adjacent units of the first electrically conductive wiring 11 and the second electrically conductive wiring 12 respectively, in order to align the alternatingly arranged first support portions 11a and the second support portions 12a in parallel, first support portions 11a and the second support portions 12a are connected through the second connection portions 12aa, each of which is extending in the second direction S from a center portion of a corresponding one of the second electrically conductive wiring 12. Each of the first support portions 11a is connected to corresponding adjacent second support portion 12a through the second connection portion 12aa. Each of the first electrically conductive wiring 11 has first connection portions 11aa extending from a center portion in the first direction F of the first electrically conductive wiring 11 toward opposite direction along the second direction S. Each of the first electrically conductive wiring 11 is connected to the first electrically conductive wiring 11 of adjacent unit through each of the first connecting portions 11aa.

The first support portions 11a and the second support portions 12a, the first connection portions 11aa and the second connection portions 12aa can be formed with any appropriate widths, all of which may be the same, portions of which may either be the same or different. The first support portions 11a and the second support portions 12a, the first connection portions 11aa and the second connection portions 12aa can be formed with any appropriate widths through respective entire lengths, all of which may be the same, portions of which may either be the same or different. Each of the width of the first support portions 11a and the second support portions 12a, the first connection portions 11aa and the second connection portions 12aa can be for example, in a range of ⅟₁₅ to ⅛ of the width of a single light-emitting device or in a range of 200 to 400 μm.

After each of the light-emitting devices is singulated, each of the singulated parts of the electrically conductive wiring 13X includes; the first electrically conductive wiring 11 and the second electrically conductive wiring 12 facing each other in the first direction F, the first connection parts 11aa connected to the first electrically conductive wiring 11 at a side opposite from the second electrically conductive wiring 12 and extending opposite directions along the second direction S, the first support portion 11a connected to the first electrically conductive wiring 11 at a side opposite from the second electrically conductive wiring 12 and extending in the second direction S, the second support portion 12a connected to the second electrically conductive wiring 12 at a side opposite from the first electrically conductive wiring 11 and extending in the second direction S, the second connection portion 12aa protruding from the first support portion 11a to a side opposite from the first electrically conductive wiring 11, and the second connection portion 12aa protruding from the second support portion 12a to a side opposite from the first electrically conductive wiring 11.

Other than above, the electrically conductive wiring 13 may include connection portions and support portions having shapes and locations that are different from that of the first support portions 11a and the second support portions 12a, and the first connection portions 11aa and the second connection portions 12aa can be employed, as long as a plurality of units each including the first electrically conductive wiring 11 and the second electrically conductive wiring 12 are connected and maintained as one part.

Disposing Light-Emitting Element and Connecting Wires: S2

Figure 10:
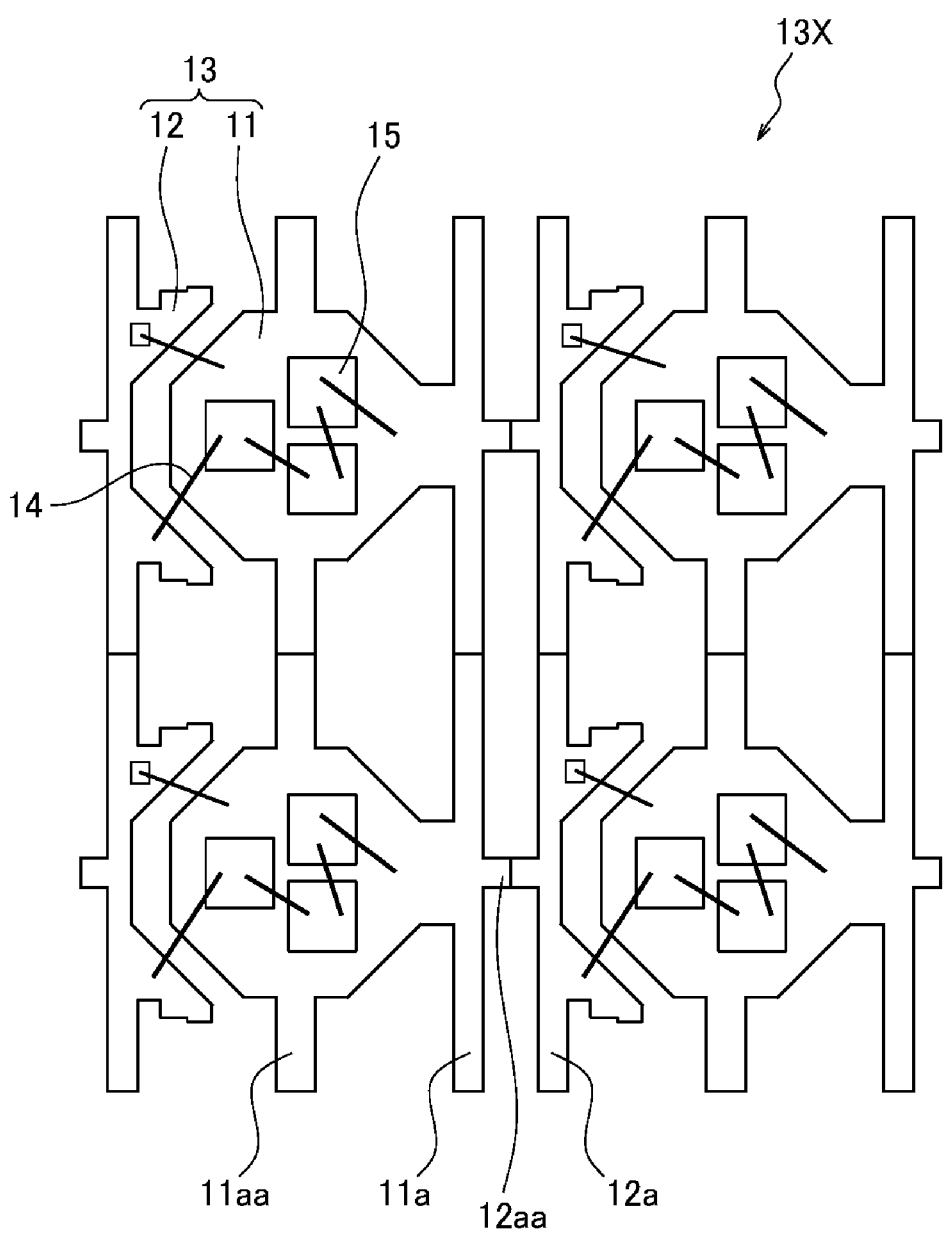
FIG. 10 is a schematic plan view for illustrating a method of manufacturing a light-emitting device according to another embodiment of the present invention.

As shown in FIG. 10, a plurality of light-emitting elements are disposed on each of the first electrically conductive wirings 11 of the electrically conductive wiring 13X.

Providing Mask Member: S3

Figure 11:
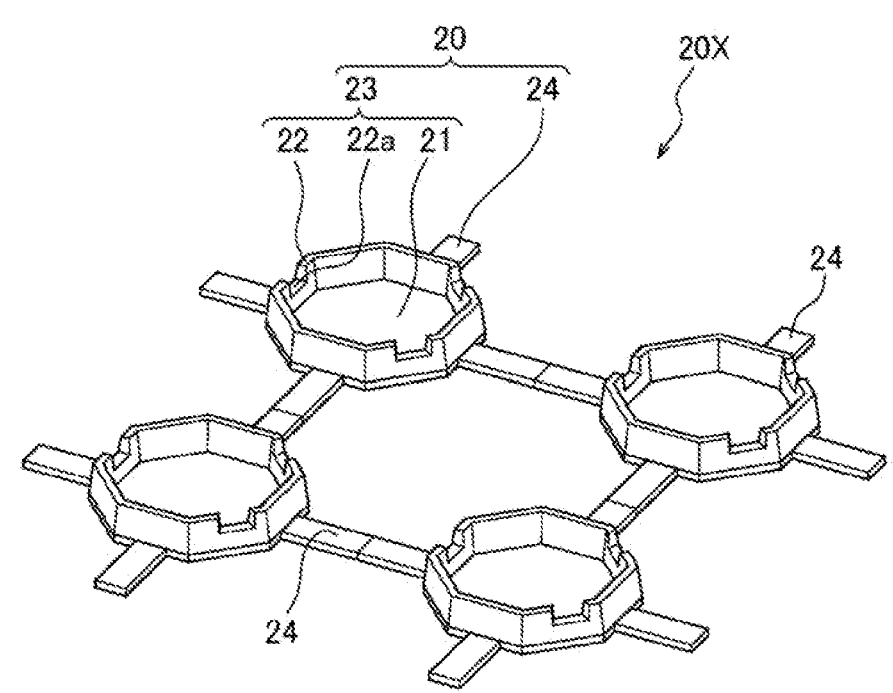
FIG. 11 is a schematic perspective view of a mask member for illustrating a method of manufacturing a light-emitting device according to another embodiment of the present invention.

As shown in FIG. 11, a mask member 20X in which a plurality of the mask parts 23 are aligned in the first direction and the second direction so as to match the arrangement of each unit of the collective electrically conductive wiring 13X to through the connection portions 24 is provided.

Disposing Mask Member to Electrically Conductive Wiring and Disposing Resin Material: S4 and S5

Figure 12:
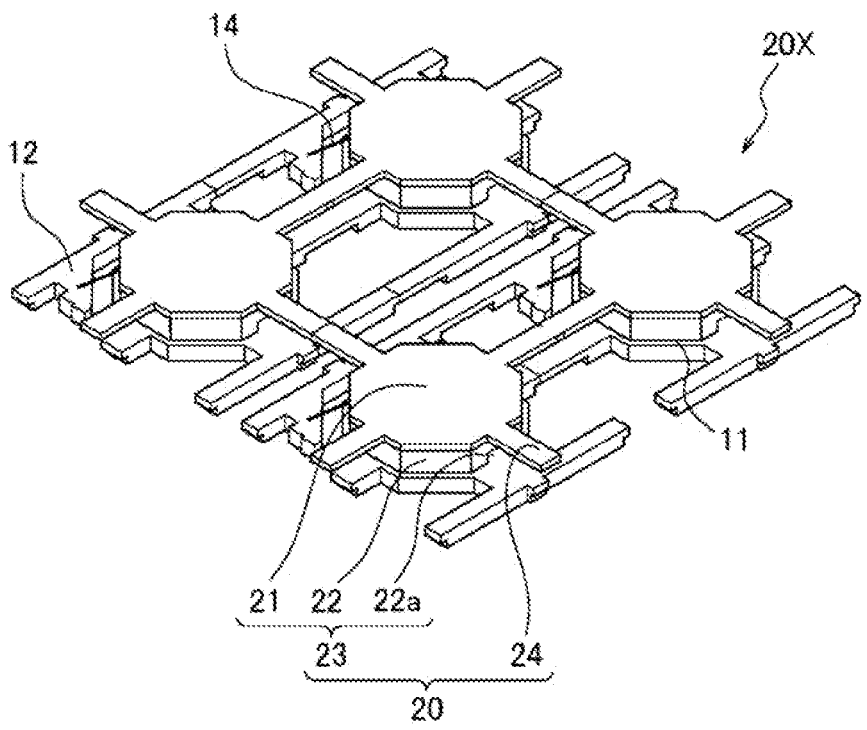
FIG. 12 is a schematic perspective view of a mask member and an electrically conductive member for illustrating a method of manufacturing a light-emitting device according to another embodiment of the present invention.

As shown in FIG. 12, the mask member 20X is disposed on the electrically conductive wiring 13X.

Subsequently, a resin material 17 is applied on the electrically conductive wiring 13X that is covered by the mask member 20X.

Then, the resin material 17 is cured (S6) before removing the mask member 20.

Removing Mask Member: S7

Subsequently, the mask member 20X is removed. Thus, as shown in FIG. 13, a plurality of resin members 16X corresponding to a plurality of light-emitting devices 10X can be formed integrally.

Dividing Resin Member: S8

Figure 13:
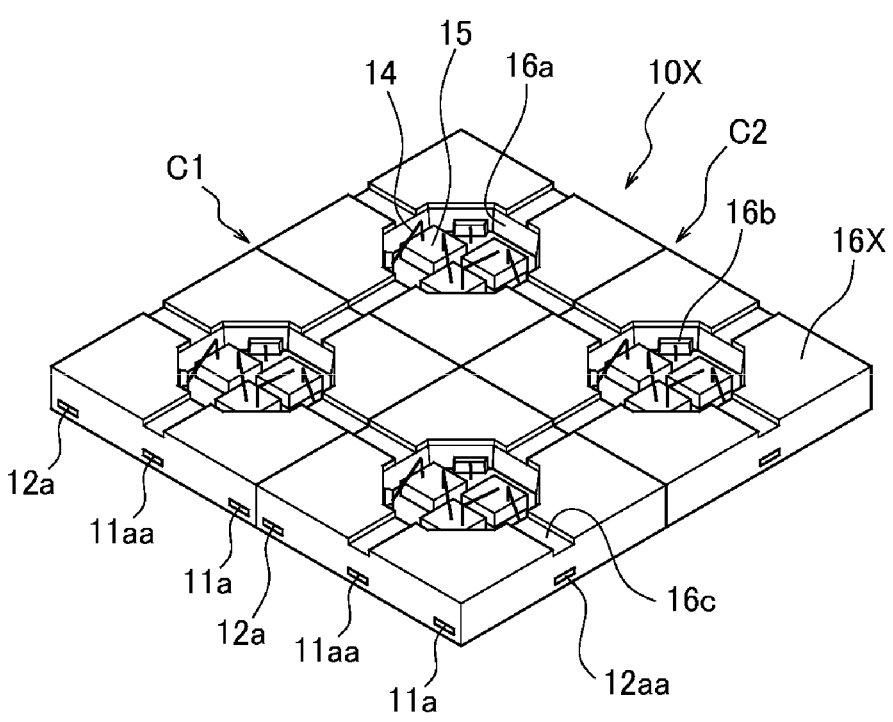
FIG. 13 is a schematic perspective view for illustrating a method of manufacturing a light-emitting device according to another embodiment of the present invention.

Then, the light-emitting devices 10X which are molded in one body of the resin member 16X are singulated by, for example, cutting along the lines indicated by arrows C1 and C2 shown in FIG. 13 (S8). Accordingly, a plurality of the light-emitting devices 10 as shown in FIGS. 7A and 7B can be obtained.

Singulating can be performed by using various techniques such as cutting with a dicing saw, cutting with a laser light, etc. By such cutting, for example, the resin member 16X and the electrically conductive wiring 13X can be cut simultaneously.

For example, along the arrow C1, the first support portions 11a, the first connection portions 11aa, the second support portions 12a are cut with the resin member 16X in a direction orthogonal to those portions. Also along the arrow C2, together with the resin member 16X, cut is performed in the direction orthogonal to the second connection portions 12aa.

The light-emitting devices 10 thus obtained do not have a portion of the electrically conductive wiring 13X protruded from the lateral surface(s)) of the resin member, such that possible occurrence of electrical failure due to a portion of the electrically conductive wiring 13X protruded from the lateral surface(s) can be reduced or avoided.

As described above, a plurality of light-emitting devices 10 can be manufactured simultaneously.

Variational Examples 2 of Method of Manufacturing Light-Emitting Device

Figure 14:
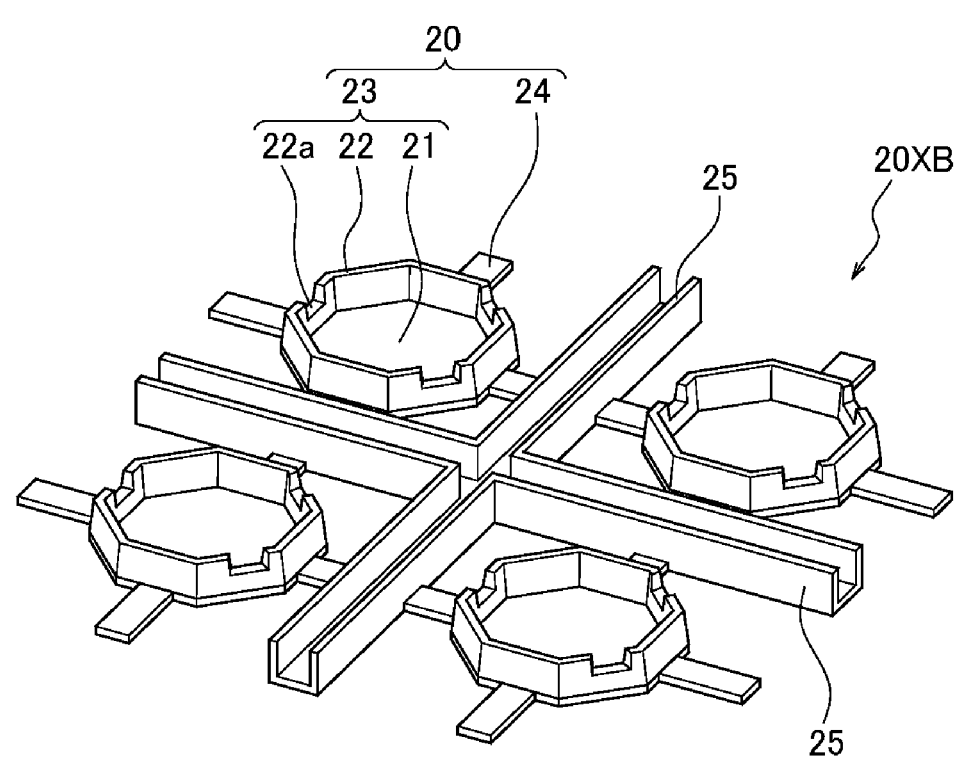
FIG. 14 is a schematic perspective view of a mask member for illustrating a method of manufacturing a light-emitting device according to still another embodiment of the present invention.

Variational Example 2 of the method of manufacturing differs from Variational Example 1 in which, as shown in FIG. 14, a mask member 20XB having a frame part 25 connected to the connection parts 24 is employed in place of the mask member 20X shown in FIG. 11.

Figure 15:
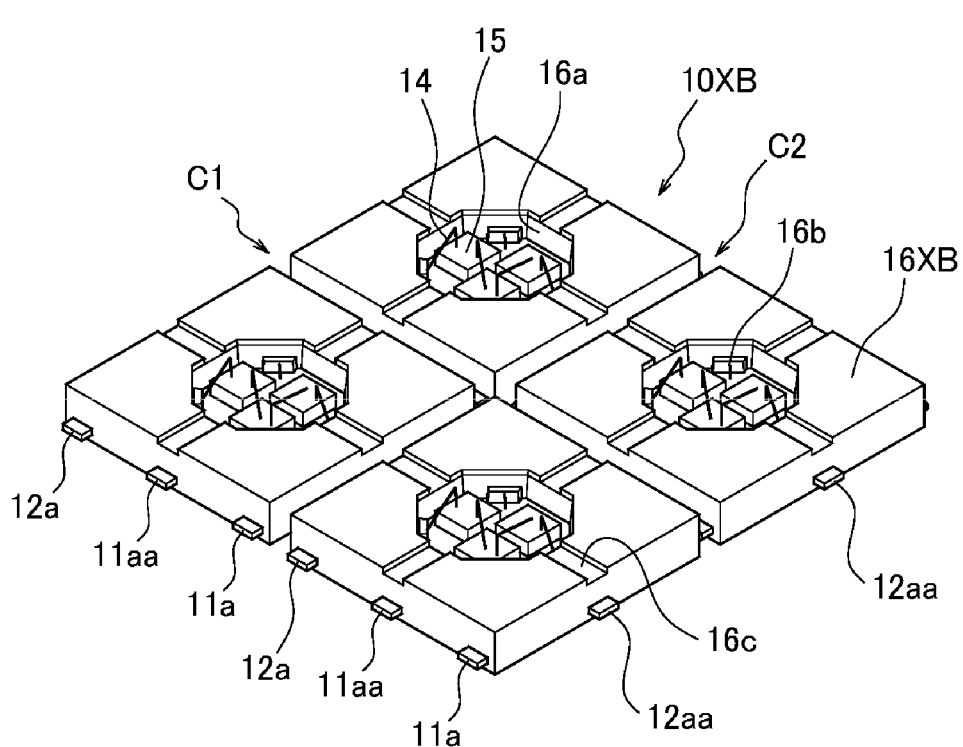
FIG. 15 is a perspective view for illustrating a method of manufacturing a light-emitting device according to still another embodiment of the present invention.

Accordingly, as shown in FIG. 15, the light-emitting device 10XB including a plurality of light-emitting devices integrally molded of the resin member 16XB can be obtained.

Compared to the mask member 20X, the mask member 20XB further includes the frame part 25 disposed on the connection parts 24 at locations corresponding to the locations between adjacent sets of the first and second electrically conductive wirings 11 and 12.

After the mask member 20XB is removed, the resin member 16XB is divided along the arrows C1 and C2 shown in FIG. 15, that is, the electrically conductive wiring 13 is cut at the locations where the frame part 25 was placed. Accordingly, a plurality of light-emitting devices 10XA shown in FIGS. 8B and 8C can be obtained.

Because only the electrically conductive wiring 13X is cut in the singulation, generation of burrs associated with the cutting of the resin member can be avoided in the light-emitting devices manufactured as described above.

When a plurality of light-emitting devices are manufactured through a state in which a plurality of light-emitting devices are integrally connected, productivity can be improved by employing the method described above.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a light-emitting device, the method comprising:

providing an electrically conductive wiring including a first electrically conductive wiring and a second electrically conductive wiring;

disposing a light-emitting part including at least one light-emitting element on the first electrically conductive wiring, and electrically connecting the light-emitting part with the first electrically conductive wiring and with the second electrically conductive wiring via wires;

providing a mask member, the mask member including a mask part including a first covering part to be located above the light-emitting part, and a second covering part connected to the first covering part and to be located around lateral sides of the light-emitting part, with the second covering part being spaced apart from lateral surfaces of the light-emitting part so as not to be in contact with the lateral surfaces of the light-emitting part, a plurality of grooves being formed in the second covering part to allow the wires to pass through respectively, from the light-emitting part to an upper surface of the first electrically conductive wiring and from the light-emitting part to an upper surface of the second electrically conductive wiring;

disposing the mask member on the electrically conductive wiring so that the mask member covers the light-emitting part;

disposing a resin material to at least partially cover outer surfaces of the mask member, the first electrically conductive wiring, and the second electrically conductive wiring; and removing the mask member to obtain a resin member having lateral walls surrounding the light-emitting part.

2. The method of manufacturing the light-emitting device according to claim 1, wherein the disposing of the resin material includes disposing the resin material by a printing method.

3. The method of manufacturing the light-emitting device according to claim 1, wherein the disposing of the resin material includes disposing the resin material to a height such that an upper surface of the first covering part of the mask member and an upper surface of the resin material are flush with each other.

4. The method of manufacturing the light-emitting device according to claim 1, wherein the disposing of the resin material includes disposing the resin material to at least partially fill at least a portion of each of the grooves to cover a portion of each of the wires passing through each of the grooves.

5. The method of manufacturing the light-emitting device according to claim 1, further comprising curing the resin material before the removing of the mask member.

6. The method of manufacturing the light-emitting device according to claim 1, wherein the disposing of the mask member includes disposing the mask member on the electrically conductive wiring such that at least one of the grooves formed in the second covering part is facing the second electrically conductive wiring, and the disposing of the resin material includes disposing the resin material in a first direction from the first electrically conductive wiring toward the second electrically conductive wiring or in a direction opposite to the first direction in a plan view.

7. The method of manufacturing the light-emitting device according to claim 1, wherein the disposing of the resin material includes disposing the resin material that is a light-reflecting resin material containing a light-reflecting material.

8. The method of manufacturing the light-emitting device according to claim 1, wherein the providing of the electrically conductive wiring includes providing the electrically conductive wiring having an alternating array of the first electrically conductive wiring and the second electrically conductive wiring, and the providing of the mask member includes providing the mask member having a plurality of additional mask parts, with adjacent ones of the mask part and the additional mask parts being connected via a connecting part.

9. The method of manufacturing the light-emitting device according to claim 8, wherein the providing of the mask member includes providing the mask member with a frame part to be disposed between respective sets of one of the first electrically conductive wiring and an adjacent one of the second electrically conductive wiring.

10. The method of manufacturing the light-emitting device according to claim 9, further comprising after the removing of the mask member, dividing a portion of the electrically conductive wiring at locations where the frame part had been placed.

11. A method of manufacturing a light-emitting device, the method comprising:

providing an electrically conductive wiring including a first electrically conductive wiring and a second electrically conductive wiring;

disposing a light-emitting part including at least one light-emitting element on the first electrically conductive wiring, and electrically connecting the light-emitting part with the first electrically conductive wiring and with the second electrically conductive wiring via wires;

providing a mask member, the mask member including a mask part including a first covering part to be located above the light-emitting part, and a second covering part connected to the first covering part and to be located around lateral sides of the light-emitting part, a plurality of grooves being formed in the second covering part to allow the wires to pass through respectively, from the light-emitting part to an upper surface of the first electrically conductive wiring and from the light-emitting part to an upper surface of the second electrically conductive wiring;

disposing the mask member on the electrically conductive wiring so that the mask member covers the light-emitting part;

disposing a resin material to at least partially cover outer surfaces of the mask member, the first electrically conductive wiring, and the second electrically conductive wiring; and removing the mask member to obtain a resin member having lateral walls surrounding the light-emitting part, wherein the disposing of the resin material includes disposing the resin material to a height such that an upper surface of the first covering part of the mask member and an upper surface of the resin material are flush with each other.

12. A method of manufacturing a light-emitting device, the method comprising:

providing an electrically conductive wiring including a first electrically conductive wiring and a second electrically conductive wiring;

disposing a light-emitting part including at least one light-emitting element on the first electrically conductive wiring, and electrically connecting the light-emitting part with the first electrically conductive wiring and with the second electrically conductive wiring via wires;

providing a mask member, the mask member including a mask part including a first covering part to be located above the light-emitting part, and a second covering part connected to the first covering part and to be located around lateral sides of the light-emitting part, a plurality of grooves being formed in the second covering part to allow the wires to pass through respectively, from the light-emitting part to an upper surface of the first electrically conductive wiring and from the light-emitting part to an upper surface of the second electrically conductive wiring;

disposing the mask member on the electrically conductive wiring so that the mask member covers the light-emitting part;

disposing a resin material to at least partially cover outer surfaces of the mask member, the first electrically conductive wiring, and the second electrically conductive wiring; and removing the mask member to obtain a resin member having lateral walls surrounding the light-emitting part, wherein the disposing of the resin material includes disposing the resin material to at least partially fill at least a portion of each of the grooves to cover a portion of each of the wires passing through each of the grooves.

* * * * *